und Staaten Patent [19]

United States Patent [19]

Shinomiya

[11] Patent Number: 5,389,778
[45] Date of Patent: Feb. 14, 1995

[54] PHOTOELECTRIC CONVERSION CIRCUIT HAVING A TUNING CIRCUIT AND CHANGEOVER SWITCHES

[75] Inventor: Kohji Shinomiya, Itami, Japan

[73] Assignee: Mitsubishi Denki Kabushiki Kaisha, Tokyo, Japan

[21] Appl. No.: 77,391

[22] Filed: Jun. 17, 1993

Related U.S. Application Data

[62] Division of Ser. No. 835,852, Feb. 18, 1992, Pat. No. 5,252,820.

[30] Foreign Application Priority Data

| Mar. 11, 1991 | [JP] | Japan | 3-72465 |
| Apr. 26, 1991 | [JP] | Japan | 3-96603 |
| Aug. 29, 1991 | [JP] | Japan | 3-218507 |
| Oct. 14, 1991 | [JP] | Japan | 3-264661 |

[51] Int. Cl.$^6$ .............. H01J 40/14; G01J 1/20; G03B 3/00
[52] U.S. Cl. .................... 250/214 R; 250/201.6; 250/561
[58] Field of Search ........... 250/214 R, 214 A, 214 C, 250/214 SW, 201.4, 201.6, 221, 222.1, 561; 356/1; 359/189; 307/311, 520; 354/403; 330/109, 294, 305, 306; 340/555, 557

[56] References Cited

U.S. PATENT DOCUMENTS

| 4,048,578 | 9/1977 | Kimura | 330/31 |
| 4,535,301 | 8/1985 | Takayama | 330/279 |
| 4,701,048 | 10/1987 | Tokuda et al. | 356/1 |
| 4,713,841 | 12/1987 | Porter et al. | |
| 4,793,000 | 12/1988 | Imano et al. | 250/214 R |
| 5,043,564 | 8/1991 | Ikuta | 250/201.4 |
| 5,148,011 | 9/1992 | Taka | 250/201.6 |
| 5,204,714 | 4/1993 | Nonaka et al. | 250/201.6 |
| 5,252,820 | 10/1993 | Shinamiya | 250/214 R |

FOREIGN PATENT DOCUMENTS

| 2154735 | 6/1972 | Germany . |
| 2248371 | 4/1974 | Germany . |
| 2431937 | 1/1976 | Germany . |
| 2553275 | 6/1977 | Germany . |

OTHER PUBLICATIONS

H. Meinke, et al., "Taschenbuch Der Hochfrequenztechnik", 1962, pp. 1476–1477.

Primary Examiner—David C. Nelms
Assistant Examiner—John R. Lee
Attorney, Agent, or Firm—Oblon, Spivak, McClelland, Maier & Neustadt, P.C.

[57] ABSTRACT

A photoelectric conversion circuit which can detect only signal light from applied light, to avoid influence by disturbance light. An anode of a photodiode (1) is grounded and an input end of a tuning circuit (5) is connected to its cathode through an input terminal (3). An output end of the tuning circuit (5) is connected to an output terminal (4) through an amplifier (6). The output terminal (4) is grounded through a load resistor (7). The tuning circuit (5) is tuned with the frequency of signal light included in light (2) which is applied to the photodiode (1). A photoelectric conversion current caused by disturbance light is removed in the tuning circuit (5), so that only a photoelectric conversion current caused by signal light is detected. Switching devices are connected to the photodiode for providing current from the photodiode to the input terminals of the amplifier.

18 Claims, 29 Drawing Sheets

PHOTOELECTRIC CONVERSION CIRCUIT HAVING A TUNING CIRCUIT AND CHANGEOVER SWITCHES

This is a division of application Ser. No. 07/835,852, filed on Feb. 18, 1992, now U.S. Pat. No. 5,252,820.

BACKGROUND OF THE INVENTION

Field of the Invention

The present invention relates to a photoelectric conversion circuit, and more particularly, it relates to a photoelectric conversion circuit which has a function of selecting signal light from light including various disturbance light components.

Description of the Background Art

FIG. 41 shows the circuit structure of a conventional photoelectric conversion circuit. Referring to FIG. 41, a photodiode (PD) 1 receives light 2, and converts the same to a photoelectric conversion current (IL). An anode of the photodiode 1 is grounded through a resistor 12. A cathode of the photodiode 1 is connected with a power terminal 10, while its anode is connected with an output terminal 4 respectively. A positive voltage is applied to the power terminal 10.

When the light 2 is applied to the photodiode 1 in the photoelectric conversion circuit having the aforementioned structure, the photoelectric conversion current IL is generated in the photodiode 1. The generated photoelectric conversion current IL causes a voltage drop in the resistor 12, whereby a voltage is developed across the resistor 12 in correspondence to the intensity of the light 2. A photoelectric conversion output can be obtained by extracting this voltage at the output terminal 4. As shown in FIG. 42, the voltage developed across the resistor 12 may be temporarily amplified by an amplifier 6, to be supplied to the output terminal 4.

FIG. 43 shows another conventional photoelectric conversion circuit. An anode and a cathode of a photodiode 1 are connected to a non-inverting input terminal (+) and an inverting input terminal (−) of a differential amplifier 15 respectively. The non-inverting input terminal is grounded through a battery (E), while the inverting input terminal is connected with an output end of the differential amplifier 15 through a resistor 12. An output terminal 4 is provided on the output end of the differential amplifier 15. Also in the photoelectric conversion circuit having the above structure, a voltage corresponding to the intensity of light 2 which is applied to the photodiode 1, i.e., a photoelectric conversion output, is obtained from the output terminal 4, similarly to the circuit shown in FIG. 41.

Such a photoelectric conversion circuit is applied to a remote-control receiver for a television, a station selecting sensor for a radio, an automatic focusing apparatus or a range finder for a camera, or the like. In the remote-control receiver for a television or the station selecting sensor for a radio, the circuit is adapted to directly receive an infrared signal which is amplitude-modulated with a constant cycle when the same is remote-controlled.

In an automatic focusing apparatus or a range finder for a camera or the like, on the other hand, the circuit receives signal light of a specific frequency, being subjected to prescribed modulation, which is applied from a light source and reflected by an object. Then the circuit evaluates the distance between the object and the automatic focusing apparatus in response to the angle between the applied signal light and the reflected signal light.

In the conventional photoelectric conversion circuit having the structure shown in FIGS. 41 and 42 or FIG. 43, the photodiode 1 converts all of the received light energy to a current so that the photoelectric conversion current is further converted to a voltage by the resistor 12, whereby light components of various frequencies such as sunlight and light of artificial illumination are also photoelectrically converted. Namely, it is impossible to detect only a desired signal light component in the conventional photoelectric conversion circuit, since the circuit also receives unwanted signal components other than a signal of a specific frequency and photoelectrically converts the same.

In the conventional photoelectric conversion circuit, therefore, a malfunction is caused in the case of a remote-control receiver for a television or a station selecting sensor for a radio, while an error is caused in an automatic focusing apparatus or a range finder for a camera.

SUMMARY OF THE INVENTION

The present invention has been proposed to solve the aforementioned problem, and an object thereof is to provide a photoelectric conversion circuit, which is provided with selective photoelectric conversion characteristics for selectively detecting only signal light being modulated at a specific frequency.

In one aspect of the present invention, the photoelectric conversion circuit comprises a photoelectric conversion element for receiving incident light including signal light which is modulated in intensity at a prescribed frequency and converting the same to a photoelectric conversion current, and a tuning input circuit having a parallel resonator which is connected with the photoelectric conversion element for electrically resonating with the prescribed frequency and conducting inductive coupling.

In another aspect of the present invention, the photoelectric conversion circuit comprises a photoelectric conversion element for receiving light including signal light which is modulated in intensity at a prescribed frequency and converting the same to a photoelectric conversion current, and a tuning input circuit having a resonator which is connected with the photoelectric conversion element for electrically resonating with the prescribed frequency, and the resonator has a $\pi$-type circuit.

Preferably, the inventive photoelectric conversion circuit further comprises a voltage limiting circuit which is connected in parallel with the resonator.

In still another aspect of the present invention, the photoelectric conversion circuit comprises first and second prescribed potentials, a semiconductor position sensing device comprising first and second electrodes and a third electrode being connected to the first prescribed potential for receiving incident light including signal light being modulated in intensity at a prescribed frequency, converting the incident light to first current and second current, and detecting position of the incident light by comparing the first current and the second current, first and second resonators both electrically resonating with the prescribed frequency, a first differential amplifier having an output end which is connected to an end of the first resonator, an inverting input which is connected to the first electrode and the other end of the first resonator in common, and an non-inverting input which is connected to the first prescribed potential, and a second differential amplifier having an output end which is connected to an end of the second resonator, an inverted input which is connected to the second electrode and the other end of the second resonator in common, and a non-inverting input which is connected to the second prescribed potential. There flows the first current between the first and third electrodes, and the second current between the second and third electrodes.

Preferably, each of the first and second resonators has a voltage limiting circuit, which has first and second terminals, and is connected in parallel to them through the first and second terminals.

In a further aspect of the present invention, the photoelectric conversion circuit comprises first and second prescribed potentials, a semiconductor position sensing device comprising first and second electrodes and a third electrode being connected to the first prescribed potential for receiving incident light including signal light being modulated in intensity at a prescribed frequency, converting the incident light to first current and second current, and detecting position of the incident light by comparing the first current and the second current, first and second resonators both electrically resonating with the prescribed frequency, a first differential amplifier having a non-inverting input which is connected to the second prescribed potential through the first resonator, as well as an output end and an inverting input which are connected with each other, and a second differential amplifier having a non-inverting input which is connected to the second prescribed potential through the second resonator, as well as an output end and an inverting input which are connected with each other.

In a further aspect of the present invention, the photoelectric conversion circuit comprises first and second prescribed potentials, a semiconductor position sensing device comprising first and second electrodes and a third electrode being connected to the first prescribed potential for receiving incident light including signal light being modulated in intensity at a prescribed frequency, converting the incident light to first current and second current, and detecting position of the incident light by comparing the first current and the second current, a resonator electrically resonating with the prescribed frequency, a differential amplifier having an output end which is connected to an end of the resonator, an inverting input which is connected to the other end of the resonator, and a non-inverting input which is connected to the second prescribed potential, a first changeover switch having a common terminal which is connected to the first electrode, a first terminal which is connected to the inverting input and a second terminal which is connected to the non-inverting input, and a second changeover switch having a common terminal which is connected to the second electrode, a first terminal which is connected to the non-inverting input and a second terminal which is connected to the inverting input. The first and second changeover switches are changed in association with each other.

In a further aspect of the present invention, the photoelectric conversion circuit comprises first and second prescribed potentials, a semiconductor position sensing device comprising first and second electrodes and a third electrode being connected to the first prescribed potential for receiving incident light including signal light being modulated in intensity at a prescribed frequency, converting the incident light to first current and second current, and detecting position of the incident light by comparing the first current and the second current, a resonator electrically resonating with the prescribed frequency, a differential amplifier having a non-inverting input which is connected to the second prescribed potential through the resonator, as well as an output end and an inverting input which are connected with each other, a first changeover switch having a common terminal which is connected to the first electrode, a first terminal which is connected to the inverting input and a second terminal which is connected to the second electrode, and a second changeover switch having a common terminal which is connected to the second electrode, a first terminal which is connected to the non-inverting input and a second terminal which is connected to the inverting input. The first and second changeover switches are changed in association with each other.

In a further aspect of the present invention, the photoelectric conversion circuit comprises a photoelectric conversion element for receiving incident light including signal light which is modulated in intensity at a prescribed frequency and converting the same to a photoelectric conversion current, a prescribed potential, a resonator which is connected between an end of the photoelectric conversion element and the prescribed potential for electrically resonating with the prescribed frequency, first amplifying means for amplifying the photoelectric conversion current with a controllable gain thereby obtaining a first signal, second amplifying means for amplifying the first signal with a constant gain thereby obtaining a second signal, and feedback means for feeding back the second signal to the first amplifying means thereby controlling a prescribed gain. The feedback means has a rectifying circuit for receiving the second signal and a smoothing circuit which is connected between the rectifying circuit and the first amplifying means.

in a further aspect of the present invention, the photoelectric conversion circuit comprises a photoelectric conversion element having first and second electrodes for receiving incident light including signal light which is modulated at a prescribed frequency and converting the same to a photoelectric conversion current, a resonator which is connected in parallel with the photoelectric conversion element for electrically resonating with the prescribed frequency, and a differential amplifier having non-inverting and inverting inputs which are connected with the first and second electrodes respectively.

Preferably, the photoelectric conversion circuit further comprises a bias circuit which is connected to at least one of the non-inverting and inverting inputs of the differential amplifier.

Preferably, the photoelectric conversion element consists essentially of a semiconductor position sensing device which has a third electrode, for converting the incident light to first current and second current, and detecting position of the incident light by comparing the first current and the second current. The first current flows between the first and third electrodes, and the second current between the second and third electrodes. The photoelectric conversion current corresponds to the difference between the first current and the second current.

In a further aspect of the present invention, the photoelectric conversion circuit comprises a photoelectric conversion element having first and second electrodes for receiving incident light including signal light which is modulated in intensity at a prescribed frequency and converting the same to a photoelectric conversion current, a resonator having a first terminal which is connected to the first electrode and a second terminal for electrically resonating with the prescribed frequency, a resistor having a first end which is connected with the second electrode and a second end which is connected with the second terminal, and a differential amplifier having a non-inverting input which is connected with the first end of the resistor and inverting input which is connected with the second end of the resistor.

According to the present invention, a photoelectric conversion system comprises a light emitting part and a light receiving part. The light receiving part has a photoelectric conversion element for receiving incident light including signal light being modulated in intensity at a prescribed frequency and converting the same to a photoelectric conversion current, a prescribed potential, a resonator being connected between an end of the photoelectric conversion element and the prescribed potential for electrically resonating with the prescribed frequency, first amplifying means for amplifying the photoelectric conversion current with a controllable gain for obtaining a first signal, second amplifying means for amplifying the first signal with a constant gain for obtaining a second signal, and feedback means for feeding back the second signal to the first amplifying means for controlling the controllable gain and outputting a detection signal.

The light emitting part has a drive circuit being connected to the detection circuit and a light emitting element being connected to the drive circuit.

The drive circuit causes a drive voltage being modulated in intensity by the prescribed frequency and performing control as to whether or not stepwise amplitude modulation is performed by the detection signal on the drive voltage.

The light emitting element is controlled by the drive voltage for emitting the signal light.

In the photoelectric conversion circuit according to the present invention, light including signal light which is modulated in intensity at a prescribed frequency is applied and photoelectrically converted in a photoelectric conversion element to provide a photoelectric conversion current, which in turn is fed to a tuning input circuit employing a resonator. Since the resonator is so set as to electrically resonate with the frequency modulating the signal light, the tuning input circuit causes a resonance phenomenon with respect to only a current component corresponding to the signal light included in the photoelectric conversion current. Thus, only the current component corresponding to the signal light is converted to a voltage in the tuning input circuit. Components of the photoelectric conversion current other than the said current component are not converted to voltages in the tuning input circuit, and not obtained as outputs.

According to the present invention, as hereinabove described, the photoelectric conversion circuit comprises a photoelectric conversion element which is exposed to signal light modulated in intensity at a prescribed frequency, and a tuning input circuit having a resonator which electrically resonates with the frequency, whereby only the signal light can be selectively extracted so that the photoelectric conversion circuit is provided with selective characteristics.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 24 is an explanatory diagram showing the polarity of a position sensitive device (PSD) 11a;

DESCRIPTION OF THE PREFERRED EMBODIMENTS

A. Basic Circuit

Before explaining various applied circuits, a basic photoelectric conversion circuit is now described.

Figure 1:
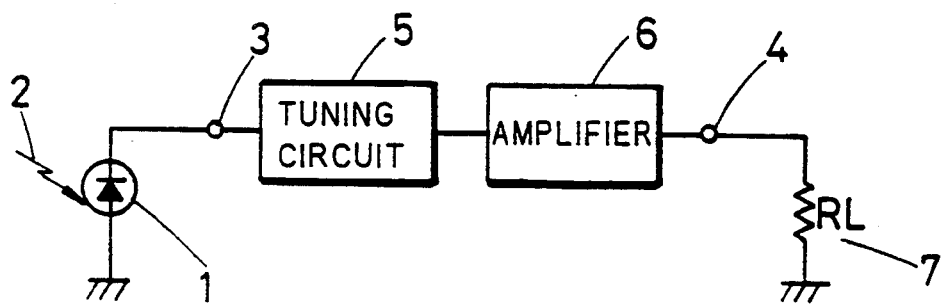
FIG. 1 is a circuit diagram showing a first embodiment of the present invention.

FIG. 1 is a block diagram showing a photoelectric converion circuit according to a first embodiment of the present invention. An anode of a photoelectric conversion element, such as a photodiode (PD) 1, for example, is grounded. An input end of a tuning circuit 5 employing a resonator is connected to a cathode of the photodiode 1 through an input terminal 3. An output end of the tuning circuit 5 is connected to an output terminal 4 through an amplifier 6. Further, the output terminal 4 is grounded through a load (RL) 7.

In the photoelectric conversion circuit having the aforementioned structure, light 2 including signal light which is modulated at a prescribed frequency is applied to the photodiode 1 and photoelectrically converted to a photoelectric conversion current, which in turn is inputted to the tuning circuit 5 employing a resonator. The signal light modulated at a prescribed frequency can be obtained through a light source which changes the luminance level of light in a constant cycle, a light source which repeats turnon and turnoff in a constant cycle, or the like. In other words, the signal light is modulated in the strength/weakness of luminance.

The resonance frequency of the resonator is previously set at a desired value to be tuned with the signal light included in the light 2, which includes various disturbance light components. Thus, the tuning circuit 5 causes a resonance phenomenon with respect to only a part, having the same frequency component as the resonance frequency of the resonator, of the photoelectric conversion current. Due to this resonance phenomenon, only the resonance component of the photoelectric conversion current is converted to a voltage by the tuning circuit 5. This voltage is amplified by the amplifier 6, and outputted at the output terminal 4. The remaining parts of the photoelectric conversion current are not obtained as outputs since the same are hardly converted to voltages in the tuning circuit 5. Namely, it is possible to select and output only signal light which is amplitude-modulated with a specific cycle by previously setting the resonance frequency of the tuning circuit 5 to be tuned with the signal light included in various disturbance light components.

Structures of various tuning circuits 5 employing resonators are now described in more concrete terms. The inventive tuning circuits 5 may be formed by parallel or series resonators having small loss, for example.

Figure 2:
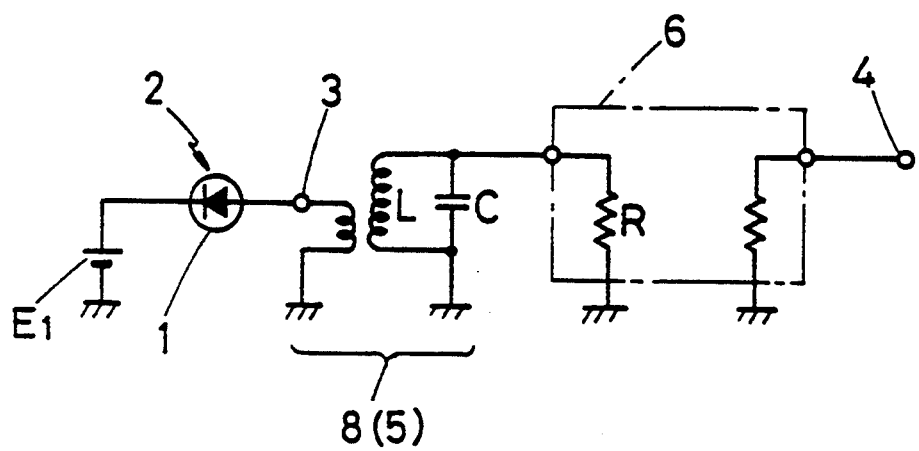
FIG. 2 is a circuit diagram showing a second embodiment of the present invention.
Figure 3:
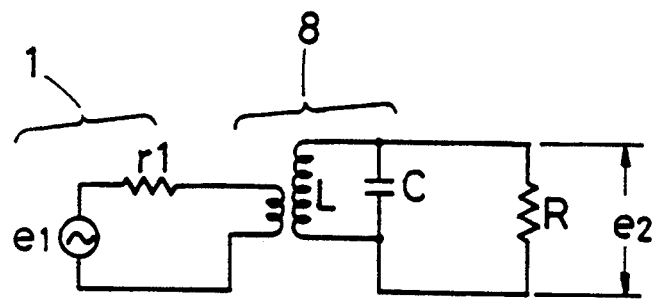
FIG. 3 is a circuit diagram showing an equivalent circuit of a part of the second embodiment.

First, tuning circuits 5 which are formed by parallel resonators are described with reference to FIGS. 2 to 5. FIG. 2 shows a second embodiment of the present invention, which is a basic circuit, and FIG. 3 is an equivalent circuit diagram showing a part of the circuit shown in FIG. 2. Referring to FIG. 2, the tuning circuit 5 is formed by a parallel resonator 8, which comprises an inductor L and a capacitor C. An end of the inductor L and that of the capacitor C are grounded in common, while the other ends thereof are connected to an input end of an amplifier 6 in common. Input impedance of the amplifier 6 is expressed by a resistor R. In the circuit shown in FIG. 2, a photodiode 1 is reverse-biased by a voltage source E1, and this portion is equivalently expressed by series connection of an ac voltage source e1 and an internal resistor r1, as shown in FIG. 3. An ideal diode and an internal parallel capacitor, which must originally be included in such an equivalent circuit of the photodiode 1, are not shown in FIG. 3. Since the impedance of the parallel resonator 8 is increased in resonance, a signal light component included in light 2 which is applied to the photodiode 1 is largely extracted in the resistor R as a voltage e2. A resonance frequency f0 and the voltage e2 are expressed as follows:

$$e2 = \frac{e1}{2}\sqrt{\frac{R}{r1}} \quad f0 = \frac{1}{2\pi\sqrt{LC}}$$

Figure 4:
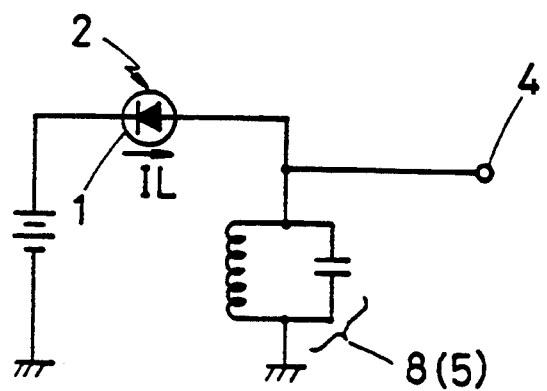
FIG. 4 is a circuit diagram showing a third embodiment of the present invention.

FIG. 4 is a circuit digram showing a third embodiment of the present invention. A photoelectric current IL flowing in a photodiode 1 is supplied to a tuning circuit 5 which is formed by a parallel resonator 8, and a voltage developed in the tuning circuit 5 is supplied to an output terminal 4 without passing through an amplifier 6, to obtain a photoelectric conversion output.

Figure 5:
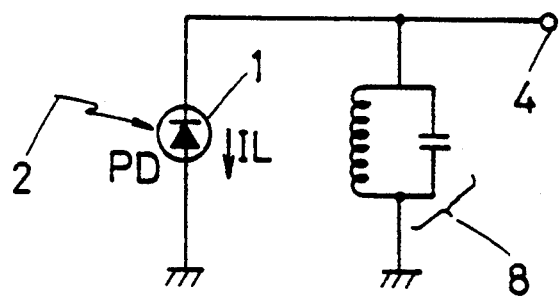
FIG. 5 is a circuit diagram showing a fourth embodiment of the present invention.

FIG. 5 is a circuit diagram showing a fourth embodiment of the present invention. A parallel resonator 8 is connected in parallel with a photodiode 1, which has a grounded anode and a cathode connected with an output terminal 4. In this case, the photodiode 1 is driven with zero bias.

Figure 6:
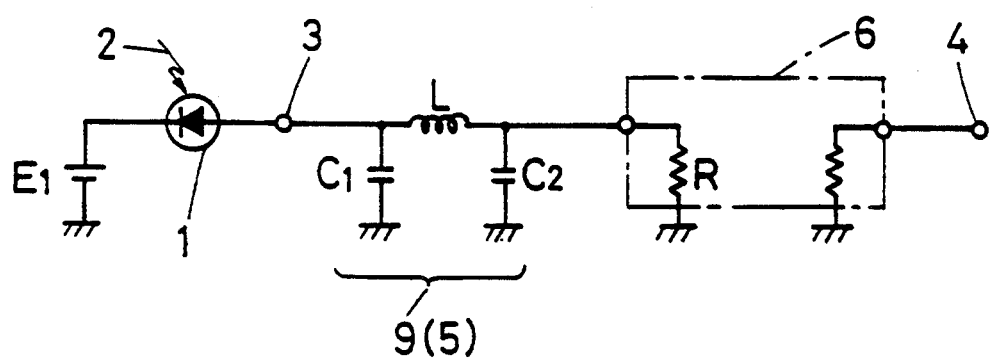
FIG. 6 is a circuit diagram showing a fifth embodiment of the present invention.
Figure 7:
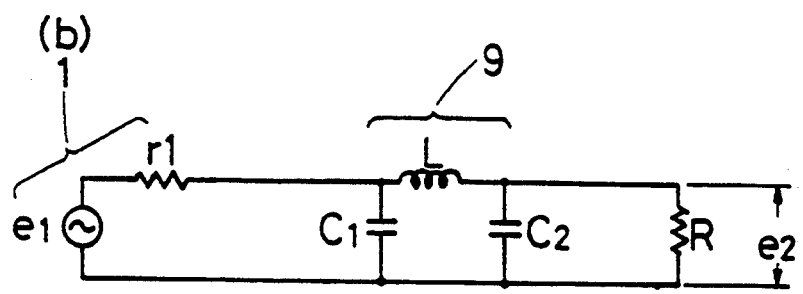
FIG. 7 is a circuit diagram showing an equivalent circuit of a part of the fifth embodiment.

Tuning circuits 5 which are formed by series resonators are now described with reference to FIGS. 6 to 8. FIG. 6 shows a fifth embodiment of the present invention, which is a basic circuit, and FIG. 7 is an equivalent circuit diagram showing a part of the circuit shown in FIG. 6. Referring to FIG. 6, the tuning circuit 5 is formed by a series resonator 9, which comprises an inductor L and capacitors C1 and C2. An end of the inductor L and that of the capacitor C1 are connected to an input terminal 3 in common, while the other end of the inductor L and an end of the capacitor C2 are connected to an input end of an amplifier 6 in common. The other ends of the capacitors C1 and C2 are grounded. Input impedance of the amplifier 6 is expressed by a resistor R. In the circuit shown in FIG. 6, the photodiode 1 is reverse-biased by a voltage source E1, and this portion is equivalently expressed by series connection of an ac voltage source e1 and an internal resistor r1 as shown in FIG. 7. Also in this case, an ideal diode and an internal parallel capacitor, which must be included in the equivalent circuit of the photodiode 1, are not shown in FIG. 7. Since the impedance of the series resonator 9 is reduced in resonance, a signal light component included in light 2 which is applied to the photodiode 1 is largely extracted as a voltage e2 in the resistor R. A resonance frequency f0 and the voltage e2 are expressed as follows:

$$e2 = \frac{e1}{2} \cdot \frac{C1}{C2} = \frac{e1}{2} \sqrt{\frac{R}{r1}}$$

$$f0 = \frac{1}{2\pi \sqrt{LC}} \quad \text{where } C = \frac{C1 \cdot C2}{C1 + C2}$$

Figure 8:
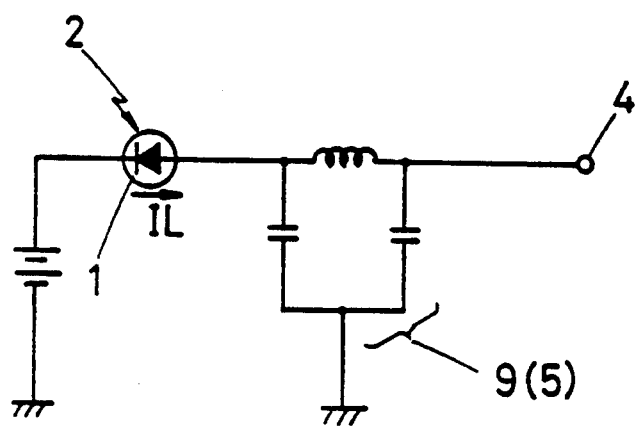
FIG. 8 is a circuit diagram showing a sixth embodiment of the present invention.

FIG. 8 is a circuit diagram showing a sixth embodiment of the present invention. A photoelectric conversion current IL flowing in a photodiode 1 is supplied to a tuning circuit 5 which is formed by a series resonator 9, and a voltage developed in the tuning circuit 5 is supplied to an output terminal 4 without passing through an amplifier 6, to obtain a photoelectric conversion ouptut.

B. Employment of Differential Amplifier

Figure 9:
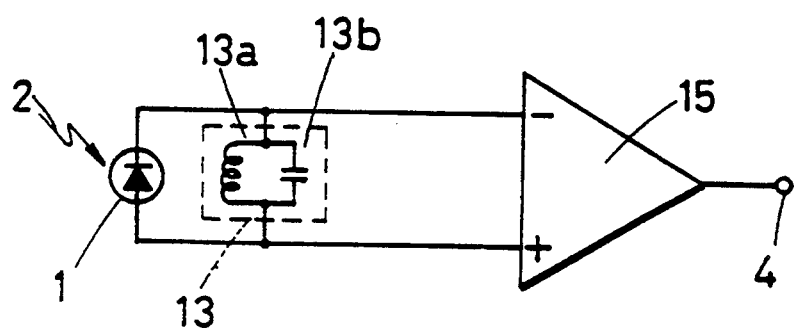
FIG. 9 is a circuit diagram showing a seventh embodiment of the present invention.

The present invention is also applicable to a photoelectric conversion circuit employing a differential amplifier. FIG. 9 shows a photoelectric conversion circuit according to a seventh embodiment of the present invention, comprising a parallel resonator 13 which is connected in parallel with a photodiode 1. The parallel resonator 13 is formed by parallel connection of an inductor 13a and a capacitor 13b, and its impedance is increased in resonance. When the resonance frequency of the parallel resonator 13 is set at the same value as the frequency of signal light, therefore, a current component, which is caused by the signal light, included in a photoelectric conversion current fed by the photodiode 1 causes a large voltage drop, while current components developed by disturbance light other than the signal light merely cause extremely small voltage drops. Namely, a differential amplifier 15 amplifies a voltage which corresponds to the signal light included in light 2 which is received therein. Thus, an output corresponding to the signal light is obtained at an output terminal 4, and influence by disturbance light can be avoided.

When crosstalks are caused by an external electric noise, electromagnetic induction or electrostatic induction from a circuit of another apparatus or the like, the same simultaneously reach both of inverting and non-inverting inputs at levels of about the same degrees, whereby the crosstalks cancel with each other by a common-mode signal removing function which is specific to the differential amplifier. Thus, it is possible to obtain only an output voltage developed by a current component of the signal light as the output of the differential amplifier 15 with no influence by crosstalks caused by an external electric noise, a circuit of another apparatus or the like.

Figure 10:
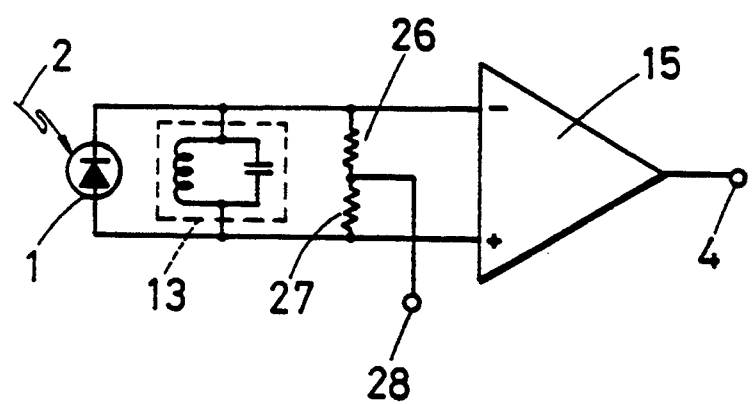
FIG. 10 is a circuit diagram showing an eighth embodiment of the present invention.

FIG. 10 is a circuit diagram showing an eighth embodiment of the present invention, which is obtained by adding a bias potential to the seventh embodiment. A bias potential is supplied to a bias terminal 28, which is connected to inverting and non-inverting inputs of a differential amplifier 15 through resistors 26 and 27 respectively. Thus, it is possible to further improve the common-mode signal removing function by appropriately selecting values of the resistors 26 and 27 and biasing the inverting and non-inverting inputs with excellent balance.

Figure 11:
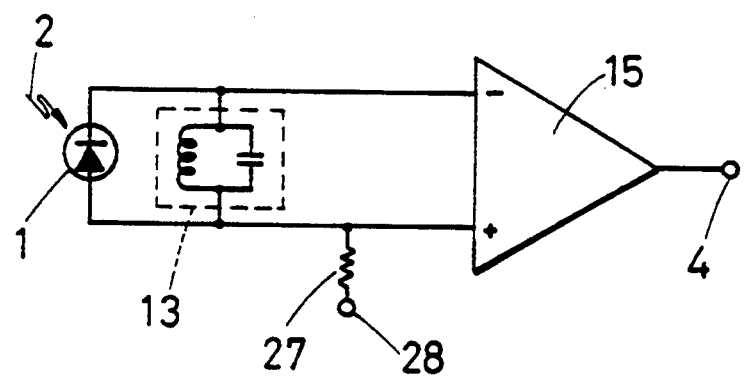
FIG. 11 is a circuit diagram showing a ninth embodiment of the present invention.

FIG. 11 shows a ninth embodiment of the present invention. This embodiment is connected in a similar manner to the seventh embodiment shown in FIG. 9, except for that a bias terminal 28 is connected to a non-inverting input of a differential amplifier 15 through a resistor 27. Also when a bias potential is supplied in such a simple manner, inverting and non-inverting inputs of the differential amplifier 15 are biased respectively, whereby it is possible to improve the common-mode signal removing function while reducing the number of components.

Figure 12:
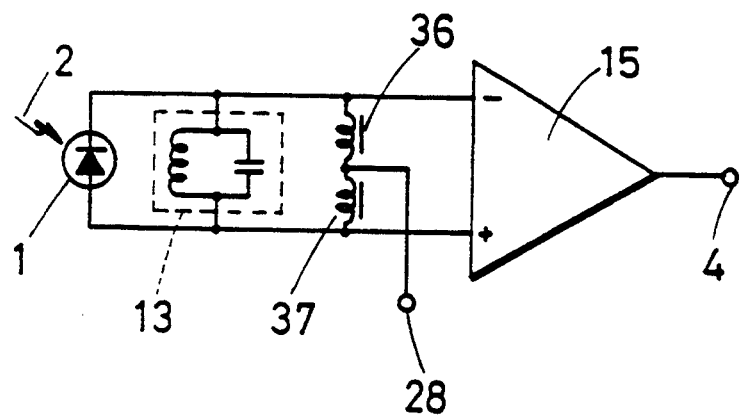
FIG. 12 is a circuit diagram showing a tenth embodiment of the present invention.

The bias voltage may be applied through choke coils, in place of resistors. FIG. 12 is a circuit diagram showing a tenth embodiment of the present invention. A bias potential is supplied to a bias terminal 28, which is connected to inverting and non-inverting inputs of a differential amplifier 15 through choke coils 36 and 37 respectively. Thus, it is possible to improve the common-mode signal removing function by appropriately selecting the values of the choke coils 36 and 37 and biasing the inverting and non-inverting inputs with excellent balance.

Figure 13:
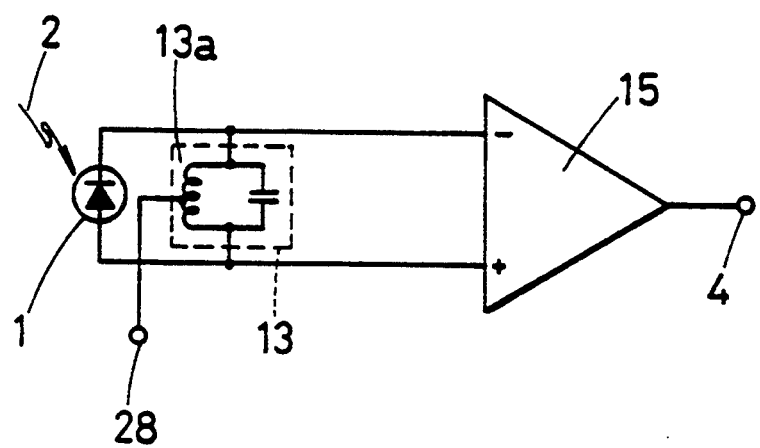
FIG. 13 is a circuit diagram showing an eleventh embodiment of the present invention.

Alternatively, an inductor 13a which is provided in a parallel resonator 13 itself can be employed as choke coil means for applying a bias potential. FIG. 13 is a circuit diagram showing an eleventh embodiment of the present invention. An intermediate tap is provided in the inductor 13a which is provided in the parallel resonator 13, and a bias terminal 28 is connected thereto for dividing the inductor 13a into two choke coils, thereby supplying a bias potential to a differential amplifier 15. Thus, it is possible to attain the same effect as the tenth embodiment with no particular bias components.

Figure 14:
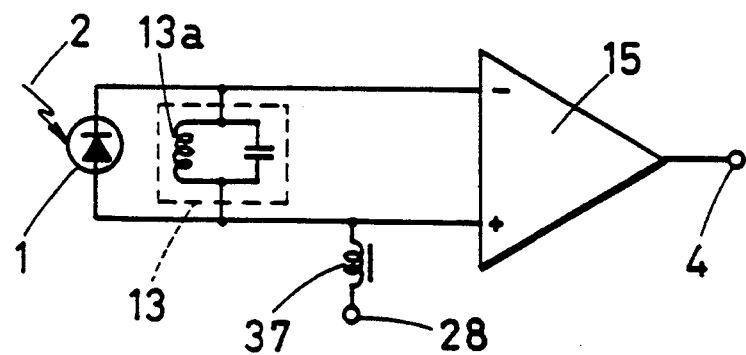
FIG. 14 is a circuit diagram showing a twelfth embodiment of the present invention.

FIG. 14 is a circuit diagram showing a twelfth embodiment of the present invention. This embodiment is connected in a similar manner to the seventh embodiment shown in FIG. 9, except for that a non-inverting input of a differential amplifier 15 is connected with a bias terminal 28 through a choke coil 37. Also when a choke coil is employed for applying bias in such a manner, it is possible to simply supply bias to the differential amplifier 15 while reducing the number of components, similarly to the ninth embodiment shown in FIG. 11.

Figure 15:
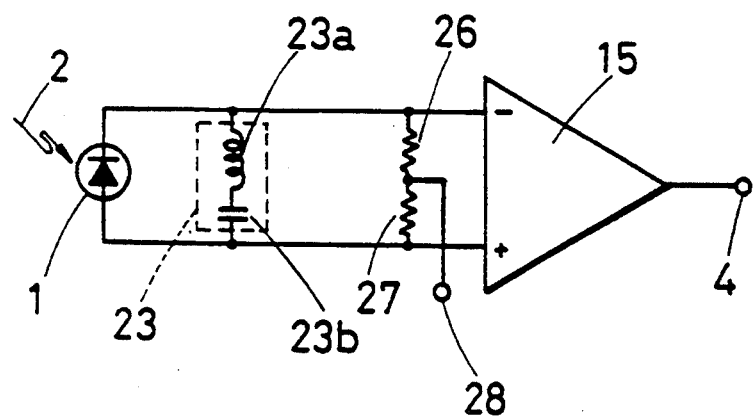
FIG. 15 is a circuit diagram showing a thirteenth embodiment of the present invention.

FIG. 15 shows a photoelectric conversion circuit according to the present invention, in which a series resonator 23 is connected in parallel with a photodiode 1. The series resonator 23 is formed by series connection of an inductor 23a and a capacitor 23b, so that its impedance is reduced in resonance and increased in non-resonance. When a bias circuit which is formed by resistors 26 and 27 and a bias terminal 28 as shown in FIG. 10 is provided and the resonance frequency of the series resonator 23 is set at the same value as the frequency of signal light, therefore, a potential applied to the bias terminal 28 is outputted at an output terminal 4 when the signal light is received. When disturbance light other than the signal light is received, on the other hand, a potential other than that applied to the bias terminal 28 is outputted at the output terminal 4 since a current flows to the resistors 26 and 27 to cause a voltage drop. According to the thirteenth embodiment, therefore, it is possible to detect two different states in relation to receiving of signal light.

Figure 16:
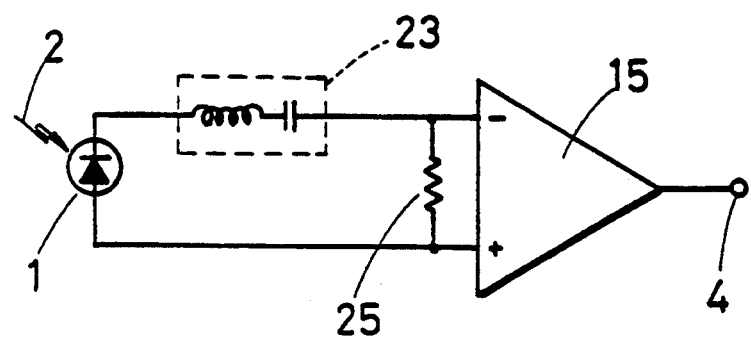
FIG. 16 is a circuit diagram showing a fourteenth embodiment of the present invention.

FIG. 16 shows a fourteenth embodiment of the present invention, in which a series resonator 23 is connected in series with a photodiode 1. An end of the series rseonator 23 is connected to a cathode of the photodiode 1, while the other end thereof is connected to an inverting input of a differential amplifier 15. An anode of the photodiode 1 is connected to a non-inverting input of the differential amplifier 15, whose inverting and non-inverting inputs are connected with each other through a resistor 25. Since the impedance of the series resonator 23 is reduced in resonance, only a voltage which is proportionate to a signal light component is developed at the resistor 25 if the resonance frequency of the series resonator 23 is set at the same value as the frequency of the signal light, and the differential amplifier 15 amplifies this voltage to supply the same to an output terminal 4. Namely, only the signal light component is extracted from applied light 2, to avoid influence by disturbance light.

Figure 17:
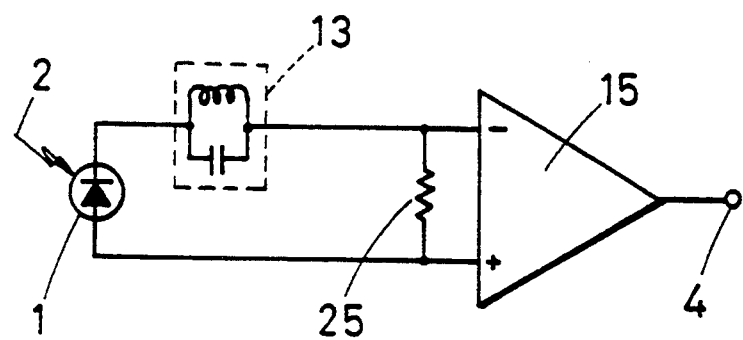
FIG. 17 ms a circuit diagram showing a fifteenth embodiment of the present invention.

FIG. 17 shows a photoelectric conversion circuit according to a fifteenth embodiment of the present invention, in which a parallel resonator 13 is connected in series with a photodiode 1. An end of the series resonator 13 is connected to a cathode of the photodiode 1, while its other end is connected to an inverting input of a differential amplifier 15. An anode of the photodiode 1 is connected to a non-inverting input of the differential amplifier 15, whose inverting and non-inverting inputs are connected with each other through a resistor 25. Since the impedance of the series resonator 13 is reduced in resonance, a disturbance light component included in applied light 2 is converted in the photodiode 1 to a photoelectric conversion current and thereafter causes a large voltage drop at the resistor 25, thereby outputting a large voltage at an output terminal 4, if the resonance frequency of the parallel resonator 13 is set at the same value as the frequency of signal light. On the other hand, the signal light component is converted to a photoelectric conversion current by the photodiode 1, and thereafter causes only a small voltage drop in the resistor 25. This is because the impedance of the parallel resonator 13 is larger as compared with the resistor 25 in resonance. When the potential at the output terminal 4 is not more than a certain threshold voltage, therefore, it is possible to decide that the signal light has been received. When such a decision is made as to receiving of the signal light, it is also possible to detect intensity change of the signal light, unlike the thirteenth embodiment shown in FIG. 15. Since the amount of the photoelectric conversion current flowing to the resistor 25 is changed in correspondence to the intensity change of the signal light and the voltage supplied to the differential amplifier 15 also corresponds to the intensity change of the signal light, a potential corresponding to the intensity change of the signal light is obtained at the output terminal 4.

Figure 18:
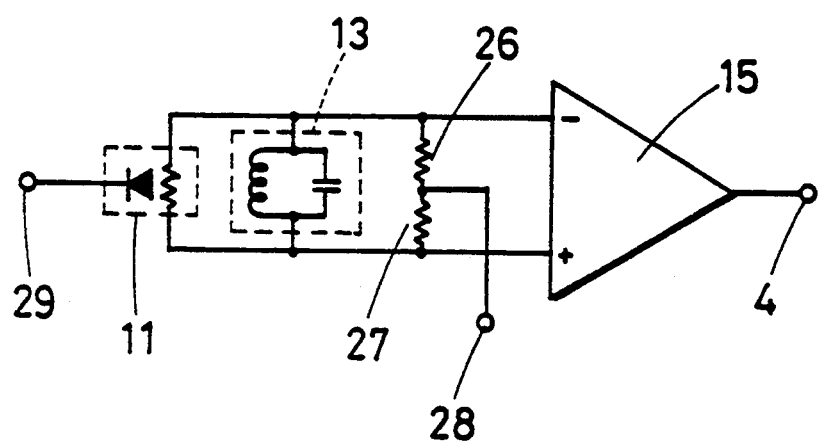
FIG. 18 is a circuit diagram showing a sixthteenth embodiment of the present invention.

Each of the seventh to fifteenth embodiments has been described with reference to the photodiode 1 which is employed as a photoelectric conversion element. However, the photoelectric conversion element is not restricted to such a photodiode, but a semiconductor position sensitive device (hereinafter referred to as "PSD") may alternatively employed, for example. FIG. 18 is a circuit diagram showing a sixteenth embodiment of the present invention, which employs a PSD. A bias terminal 29 is connected to a cathode of a PSD 11, and supplied with a positive potential. A parallel resonator 13 is connected in parallel with two anodes of the PSD 11, while both ends of the parallel resonator 13 are connected to inverting and non-inverting inputs of a differential amplifier 15 respectively. The both inputs of the differential amplifier 15 are supplied with bias potentials by resistors 26 and 27 and the bias terminal 28, similarly to the eighth embodiment shown in FIG. 10. Thus, it is possible to avoid influence by disturbance light and obtain a photoelectric conversion circuit having a high common-mode signal removing function, similarly to the eighth embodiment.

The PSD having two anode terminals may also be applied to a range finder. The present invention is now described in relation to application of a PSD to a range finder.

C. Photoelectric Conversion Circuit for Range Finder employing PSD

Figure 44:
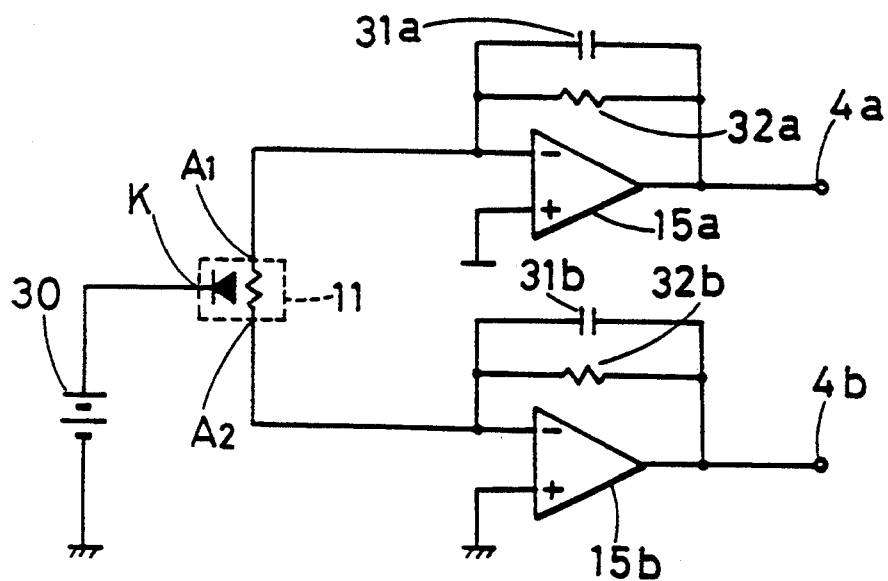
FIG. 44 is a circuit diagram showing a conventional photoelectric conversion circuit for a range finder.

Referring to FIG. 44, a photoelectric conversion circuit for a range finder is now described. As shown in FIG. 44, a cathode K of a PSD 11 is connected to a positive terminal of a bias dc power source 30, whose negative terminal is grounded. First and second anodes A1 and A2, which are first and second electrodes of the PSD 11, are connected to inverting input terminals of first and second differential amplifiers 15a and 15b respectively, while non-inverting input terminals of the first and second differential amplifiers 15a and 15b are grounded in common. A parallel circuit of a ripple removing capacitor 31a and a current-to-voltage conversion resistor 32a is connected between the inverting input terminal of the first differential amplifier 15a and a first output terminal 4a, while a parallel circuit of a ripple removing capacitor 31b and a current-to-voltage conversion resistor 32b is similarly connected between the inverting input terminal of the second diffrerential amplifier 15b and a second output terminal 4b.

Since the first differential amplifiers 15a and 15b are provided with negative feedback, the inverting and noninverting terminals thereof are at the same potential, i.e., the ground potential, whereby the first and second anodes A1 and A2 of the PSD 11 are also at the ground potential.

When spot light enters the PSD 11 which is reverse-biased by a dc power source 30, a photoelectric conversion current flows in a divided manner to the first and second anodes A1 and A2 in response to the distance between an electric central position of the PSD 11 and the position of the center of gravity of the incident spot light. The first and second anodes A1 and A2 respectively output first and second photoelectric conversion currents, which in turn are ripple-removed by the capacitors 31a and 31b and current-to-voltage converted by the resistors 32a and 32b respectively, to be outputted from the first and second output terminals 4a and 4b as voltages. Due to the characteristics of the PSD 11, it is possible to detect the incident position of the light on the PSD 11 from the ratio of the first output voltage to the second output voltage regardless of the amount of the incident light.

Also in such a photoelectric conversion circuit for a range finder, it is possible to accurately select and extract only a signal by prescribed spot light while avoiding influence by various disturbance light components such as sunlight, light of artificial illumination and the like which are incident upon the PSD 11 with the prescribed spot light to be detected, by applying the present invention. In other words, it is possible to selectively perform current-to-voltage conversion of only an electric signal which is obtained by photoelectrically converting light energy of a specific frequency.

Figure 19:
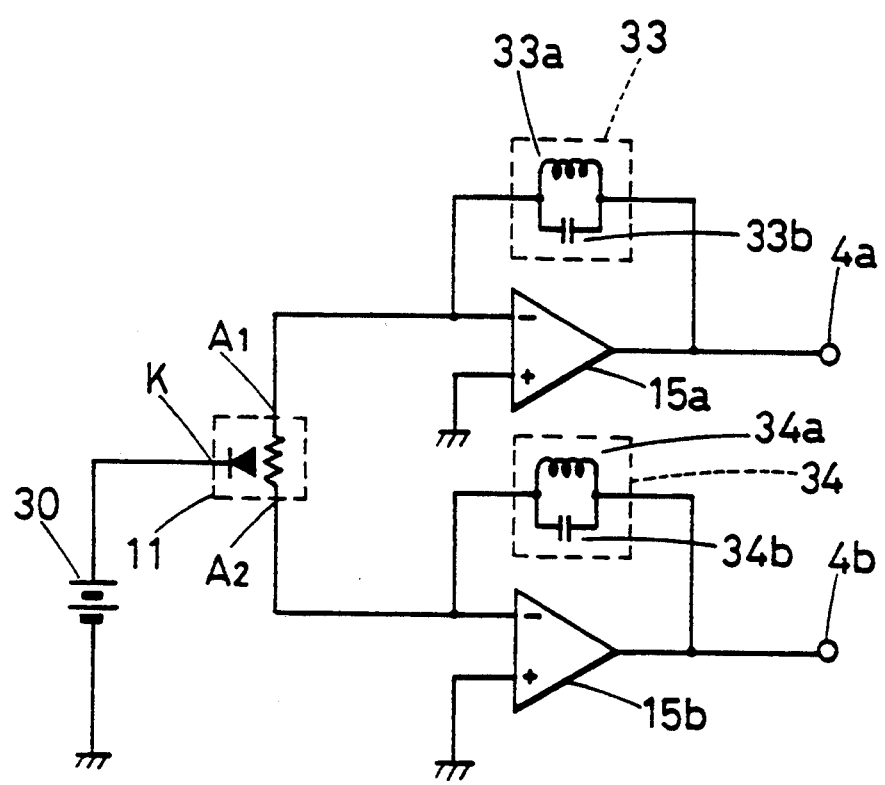
FIG. 19 is a circuit diagram showing a seventeenth embodiment of the present invention.

FIG. 19 is a circuit diagram showing a photoelectric conversion circuit for a range finder according to a seventeenth embodiment of the present invention. This embodiment is different from the structure shown in FIG. 44 in that a first parallel resonator 33 which is formed by an inductor 33a and a capacitor 33b is connected between an inverting input terminal of a first differential amplifier 15a and a first output terminal 4a in place of the parallel circuit of the capacitor 31a and the resistor 32a, and a second parallel resonator 34 which is formed by an inductor 34a and a capacitor 34b is connected between a non-inverting input terminal of a second differential amplifier 15b and a second output terminal 4b in place of the parallel circuit of the capacitor 31b and the resistor 32b.

Due to negative feedback by the first and second parallel resonators 33 and 34, the respective inverting and non-inverting input terminals of the first and second differential amplifiers 15a and 15b are at the same potentials and first and second anodes A1 and A2 of a PSD 11 are at the ground potential, which is a reference potential, in principle. When input offsets are caused in the first and second differential amplifiers 15a and 15b, however, the input offset voltages cause errors. Thus, it is preferable to bring the first and second anodes A1 and A2 of the PSD 11 into the same potentials by selecting differential amplifiers having the minimum input offset voltages.

In the range finder, a signal light source is prepared from that subjected to amplitude modulation at a prescribed frequency, to emit signal light of a constant frequency. Inductance values of the inductors 33a and 34a and capacitance values of the capacitors 33b and 34b are so set that the resonance frequencies of the first and second parallel resonators 33 and 34 are equal to the frequency of the signal light. When the PSD 11 receives the signal light from the light source with various disturbance light components including various frequency components, first and second photoelectric conversion currents from the first and second anodes A1 and A2 of the PSD 11 flow to the first and second parallel resonators 33 and 34 respectively, to be subjected to current-to-voltage conversion.

Since the resonance frequencies of the first and second parallel resonators 33 and 34 are set at the same value as the frequency of the signal light, the first and second parallel resonators 33 and 34 are at high impedance values with respect to the current component of the signal light included in the photoelectric conversion currents, while the same are at low impedance values as to current components other than that of the signal light. Therefore, voltage drops across the first and second parallel resonators 33 and 34 are extremely small with respect to the current components other than that of the signal light and develop no voltages, while voltages are developed by voltage drops of the parallel resonators 33 and 34 which are at high impedance values with respect to the current component of the signal light, so that output voltages caused by the current component of the signal light appear at first and second output terminals 4a and 4b respectively.

According to this embodiment, the first and second photoelectric conversion currents caused by the PSD 11 are outputted through the respective ones of the first and second differential amplifiers 15a and 15b which are provided with negative feedback by the respective ones of the first and second parallel resonators 33 and 34, whereby the first and second photoelectric conversion currents are subjected to frequency selection and current-to-voltage conversion by the first and second parallel resonators 33 and 34, so that it is possible to selectively extract only the voltage by the signal light of the specific frequency. Thus, an incident position to the PSD 11 can be accurately detected from the ratio of output voltages of the first and second output terminals 4a and 4b, to enable high-accuracy range finding.

In this case, it is possible to improve current-to-voltage conversion efficiency by preparing the first and second differential amplifiers 15a and 15b from those having sufficiently high input impedance characteristics.

Figure 20:
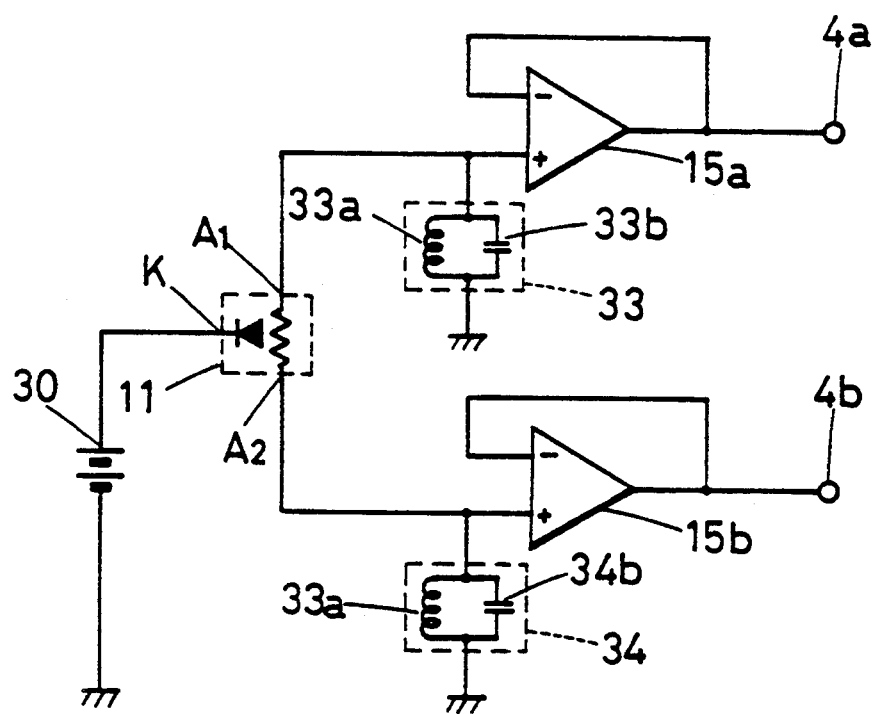
FIG. 20 is a circuit diagram showing an eighteenth embodiment of the present invention.

FIG. 20 is a circuit diagram showing a photoelectric conversion circuit for a range finder according to an eighteenth embodiment of the present invention. This embodiment is different from that shown in FIG. 19 in that first and second output terminals 4a and 4b are directly connected to respective inverting input terminals of first and second differential amplifiers 15a and 15b to provide negative feedback, and first and second parallel resonators 33 and 34 are connected between non-inverting input terminals of the first and second differntial amplifiers 15a and 15b and the ground.

The first and second parallel resonators 33 and 34 are thus connected between the respective non-inverting input terminals of the first and second differential amplifiers 15a and 15b and the ground, so that first and second photoelectric conversion currents from a PSD 11 flow to the ground through the respective ones of the first and second parallel resonators 33 and 34 to be subjected to current-to-voltage conversion respectively and potentials at the respective non-inverting and inverting input terminals of the first and second differential amplifiers 15a and 15b are identical to each other by negative feedback, whereby this circuit defines a voltage follower circuit, and output voltages appear at the repective ones of the output terminals 4a and 4b.

Thus, it is possible to selectively extract only a voltage by signal light of a specific frequency, similarly to the seventeenth embodiment. When the PSD 11 and the first and second differential amplifiers 15a and 15b are integrated, further, only two exterior pins are required for connecting the first and second parallel resonators 33 and 34 to the non-inverting input terminals of the first and second differential amplifiers 15a and 15b respectively. Thus, the number of the exterior pins can be reduced as compared with the seventeenth embodiment, which requires four pins in total for connecting the respective both ends of the first and second parallel resonators 33 and 34.

Figure 21:
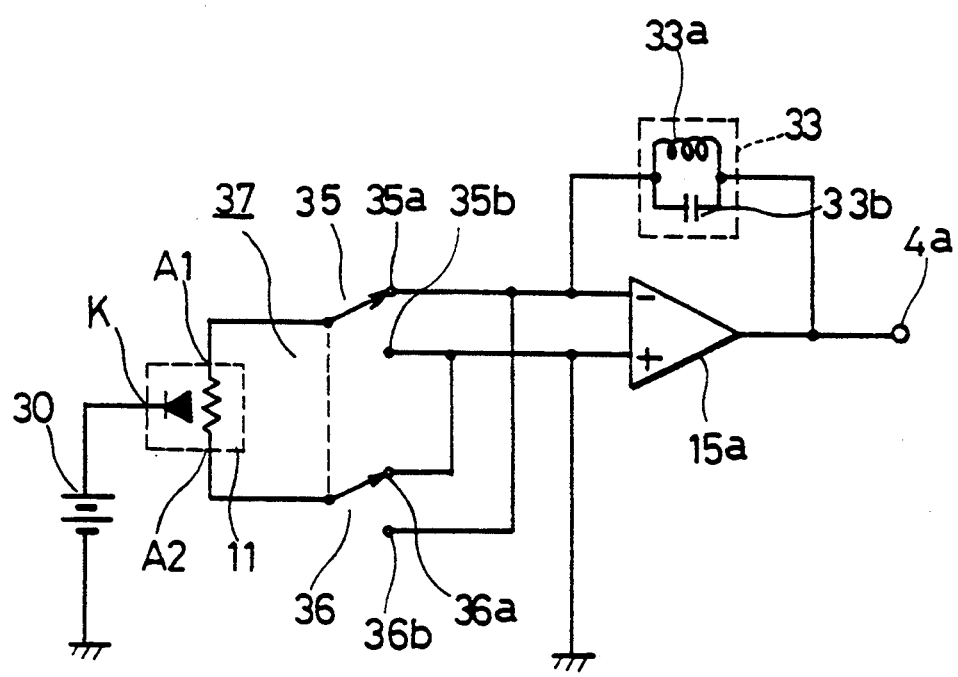
FIG. 21 is a circuit diagram showing a nineteenth embodiment of the present invention.

FIG. 21 is a circuit diagram showing a photoelectric conversion circuit for a range finder according to a nineteenth embodiment of the present invention. This embodiment is different from that shown in FIG. 19 in that the second differential amplifier 15b and the second parallel resonator 34 appearing in FIG. 19 are omitted and only a first differential amplifier 15a and a first parallel resonator 33 are provided, while a switching part 37 is provided between a PSD 11 and the differential amplifier 15a. The switching part 37 is formed by first and second changeover switches 35 and 36 which are switched in association with each other. Common terminals of the changeover switches 35 and 36 are connected to first and second anodes A1 and A2 respectively, while first and second terminals 35a and 35b of the first changeover switch 35 are connected to inverting and non-inverting input terminals of the differential amplifier 15a respectively and first and second terminals 36a and 36b of the second changeover switch 36 are connected to non-inverting and inverting input terminals of the differential amplifier 15a respectively.

When the first and second changeover switches 35 and 36 are switched toward the respective first terminals 35a and 36a in the switching part 37, the first and second anodes A1 and A2 of the PSD 11 are connected to the inverting and non-inverting input terminals of the differential amplifier 15a through the first and second changeover switches 35 and 36, whereby a first photoelectric conversion current from the first anode A1 of the PSD 11 flows in the parallel resonator 33 to be subjected to current-to-voltage conversion by the parallel resonator 33, so that an output voltage developed through a voltage drop by the parallel resonator 33 appears at an output terminal 4a.

When the first and second changeover switches 35 and 36 are switched toward the second terminals 35b and 36b in the switching part 37, on the other hand, the first and second anodes A1 and A2 of the PSD 11 are connected to the non-inverting and inverting input terminals of the differential amplifier 15a through the first and second changeover switches 35 and 36 respectively, whereby a second photoelectric conversion current from the second anode A2 of the PSD 11 flows in the parallel resonator 33 to be subjected to current-to-voltage conversion by the parallel resonator 33, so that an output voltage developed through a voltage drop by the parallel resonator 33 appears at the output terminal 4a.

Since impedance of the parallel resonator 33 is increased in resonance, only a photoelectric conversion current component of a signal having the same frequency as the resonance frequency is subjected to current-to-voltage conversion, and no photoelectric conversion current components of light components having other frequencies are subjected to current-to-voltage conversion. Thus, an effect identical to that of the seventeenth embodiment can be attained by comparing the two photoelectric conversion outputs which are obtained at the output terminal 4a by switching the changeover switches 35 and 36.

Further, the number of circuit elements can be reduced as compared with the seventeenth embodiment since the circuit may be provided with only one differential amplifier and only one parallel resonator, while no adjustment is required for arranging characteristics of two parallel resonators.

Figure 22:
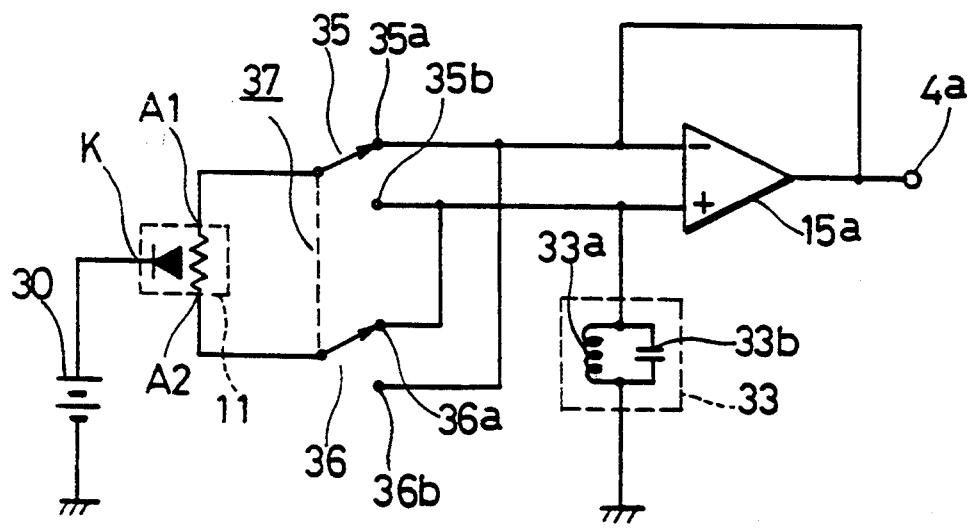
FIG. 22 is a circuit diagram showing a twentieth embodiment of the present invention.

It is also possible to reduce the differential amplifier and the parallel resonator in the eighteenth embodiment shown in FIG. 20, by providing changeover switches 35 and 36. FIG. 22 is a circuit diagram showing a photoelectric conversion circuit for a range finder according to a twentieth embodiment of the present invention. This embodiment is different from that shown in FIG. 21 in that an output terminal 4a is directly connected to the inverting input terminal of the differential amplifier 15a shown in FIG. 21 to provide negative feedback, while a parallel resonator 33 is connected between a non-inverting input terminal of the differential amplifier 15a and the ground. Thus, it is possible to obtain a voltage by signal light of a specific frequency similarly to the eighteenth embodiment, to reduce the number of adjusted portions similarly to the nineteenth embodiment.

Figure 23:
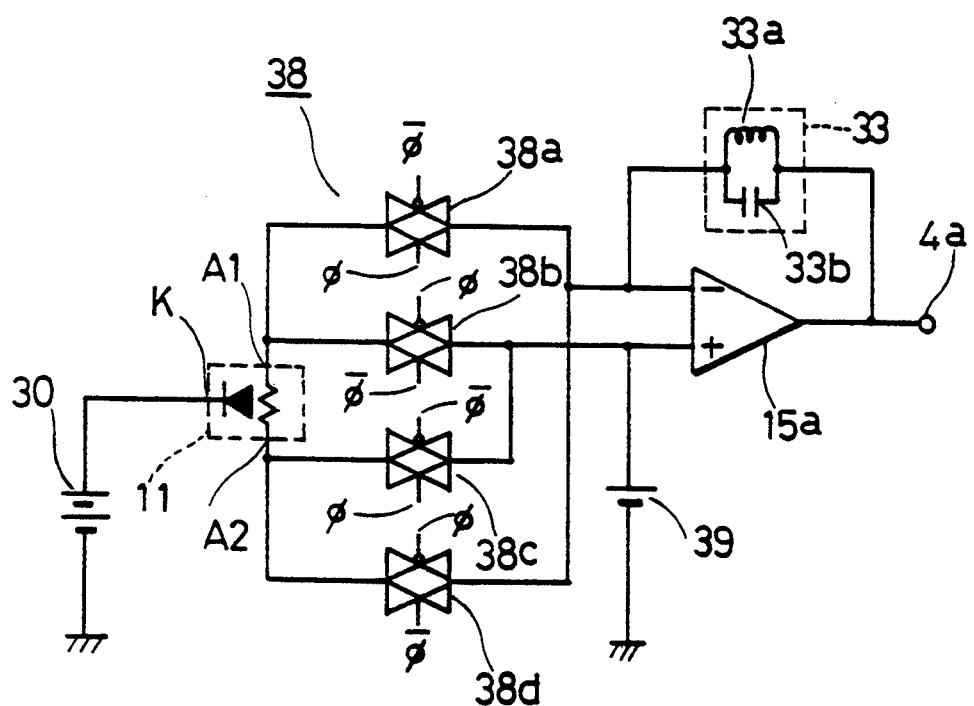
FIG. 23 is a circuit diagram showing a twenty-first embodiment of the present invention.

The changeover switches 35 and 36 are not restricted to the structures of the above embodiments, but the same may alternatively be implemented by transmission gates, for example. FIG. 23 is a circuit diagram showing a photoelectric conversion circuit for a range finder according to a twenty-first embodiment of the present invention. Transmission gates 38a and 38b as well as 38c and 38d are employed in place of the changeover switches 35 and 36 of the nineteenth embodiment shown in FIG. 21 respectively, to switch one of first and second anodes A1 and A2 to an inverting input of a differential amplifier 15a. Namely, first ends of the transmission gates 38a and 38b are connected to the first anode A1 and those of the transmission gates 38c and 38d are connected to the second anode A2 respectively, while second ends of the transmission gates 38b and 38c are connected to a non-inverting input of the differential amplifier 15a and those of the transmission gates 38a and 38d are connected to the inverting input respectively. The transmission gates 38a, 38b, 38c and 38d are on-off controlled by two-phase clocks $\phi$ and $\bar{\phi}$. When the transmission gates 38a and 38c are simultaneously turned on, the transmission gates 38b and 38d are turned off so that a first photoelectric conversion current from the first anode A1 is supplied to the differential amplifier 15a and a parallel resonator 33. When the transmission gates 38b and 38d are simultaneously turned on, on the other hand, the transmission gates 38a and 38c are turned off so that a second photoelectric conversion current from the second anode A2 is supplied to the differential amplifier 15a and the parallel resonator 33. A reference voltage 39 is supplied to the non-inverting input of the differential amplifier 15a, so that an output signal based on this voltage appears at an output terminal 4a. Thus, an effect identical to that of the nineteenth embodiment is also attained in this embodiment. A similar effect is attained also when the reference power source 39 is removed and the non-inverting input of the differential amplifier 15a is directly grounded.

The switching part is not restricted to the aforementioned transmission gates but may be formed by other semiconductor switches, as a matter of course.

Figure 24:
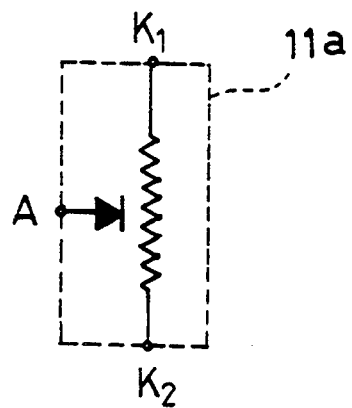

In each of the seventeenth to twenty-first embodiments, the PSD 11 has one cathode K and first and second anodes A1 and A2. However, the present invention is also applicable to a photoelectric conversion circuit for a range finder, which is provided with a PSD 11a having one anode A and first and second cathodes K1 and K2, as shown in FIG. 24.

Figure 25:
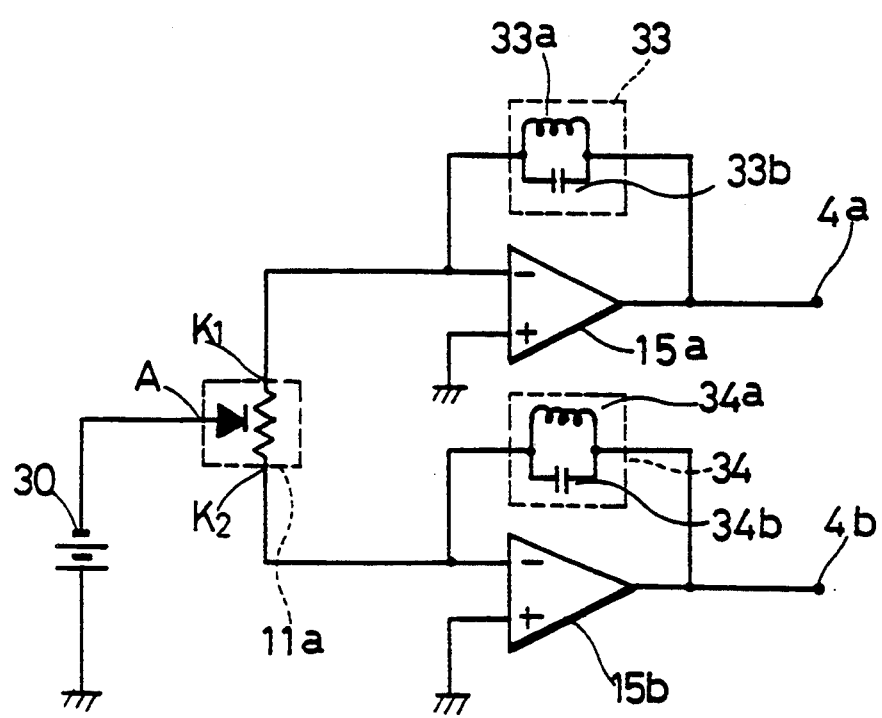
FIG. 25 is a circuit diagram showing a twenty-second embodiment of the present invention.

FIG. 25 is a circuit diagram showing a photoelectric conversion circuit for a range finder according to a twenty-second embodiment of the present invention. This embodiment is different from the seventeenth embodiment shown in FIG. 19 in that a PSD 11a is substituted for the PSD 11, first and second cathodes K1 and K2 are connected to inverting inputs of differential amplifiers 15a and 15b respectively, and a negative potential is applied to an anode A by a dc power source 30. According to this embodiment, therefore, it is possible to attain an effect similar to that of the seventeenth embodiment, since its operation is similar to that shown in FIG. 19 except for that directions of photoelectric conversion currents are reversed. It is also possible to attain a structure similar to each of the eighteenth to twenty-first embodiments through the PSD 11a.

The parallel resonators 33 and 34 are increased in impedance with respect to a current of the same frequency as the resonance frequencies thereof, while the same are reduced in impedance with respect to currents of different frequencies. Such impedance change is determined by Q values of the parallel resonators 33 and 34, and voltages across the parallel resonators 33 and 34 in resonance are extremely increased when the Q values are at high levels. Thus, it is preferable to prevent a malfunction, breakage of circuit elements etc. which may be caused by generation of excessive voltages at the parallel resonators 33 and 34.

Figure 26:
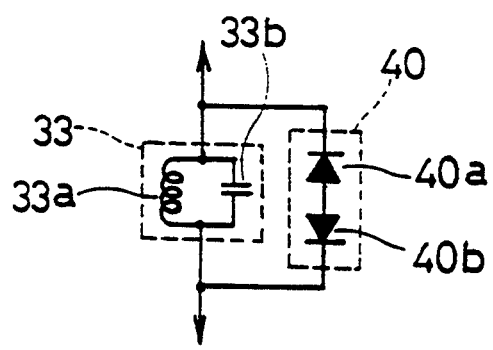
FIG. 26 is a circuit diagram showing a parallel resonance circuit 33 provided with a voltage limiting circuit 40.

FIG. 26 shows a parallel resonator 33, which is provided with a voltage limiting circuit 40 in consideration of such circumstances. The voltage limiting circuit 40 is formed by two diodes 40a and 40b, whose anodes are connected in common. This voltage limiting circuit 40 is connected in parallel with the parallel resonator 33. Assuming that VF represents a forward voltage of the diodes and BVR represents a reverse breakdown voltage, a voltage generated at the parallel resonator 33 is limited to VL (=VF+BVR) by the voltage limiting circuit 40.

The voltage limiting circuit 40 having the aforementioned structure can be provided for the parallel resonators 33 and 34, to be applied to the seventeenth embodiment shown in FIG. 19.

Figure 27:
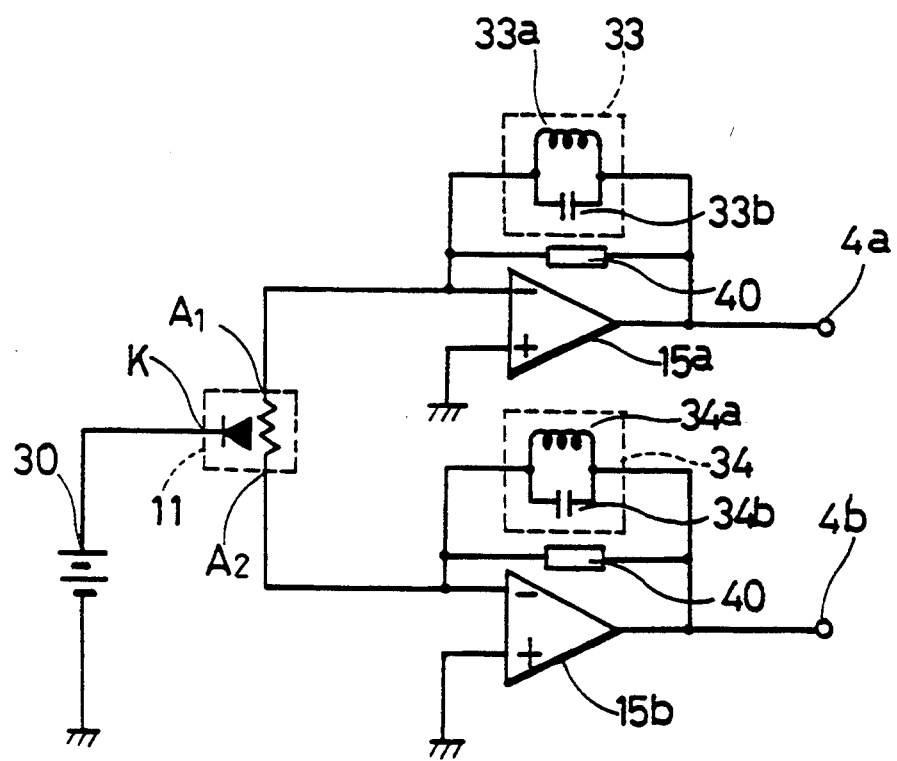
FIG. 27 is a circuit diagram showing a twenty-third embodiment of the present invention.

FIG. 27 is a circuit diagram showing a photoelectric conversion circuit for a range finder according to a twenty-third embodiment of the present invention. According to this embodiment, an operation similar to that of the seventeenth embodiment is performed while it is possible to avoid a malfunction and breakage of circuit elements.

Figure 28:
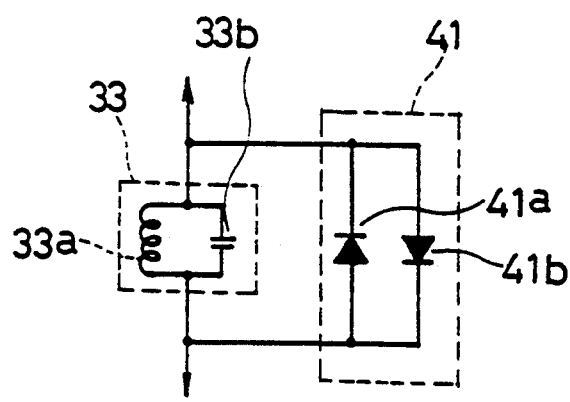
FIG. 28 is a circuit diagram showing a parallel resonance circuit 33 provided with a voltage limiting circuit 41.

FIG. 28 shows a voltage limiting circuit 41 of another structure. The voltage limiting circuit 41 is formed by parallel connection of two diodes 41a and 41b. An anode and a cathode of the diode 41a are connected to a cathode and an anode of the diode 41b respectively, and these are further connected in parallel with a parallel resonator 33. In this case, a voltage generated at the parallel resonator 33 is limited to VF.

Figure 29:
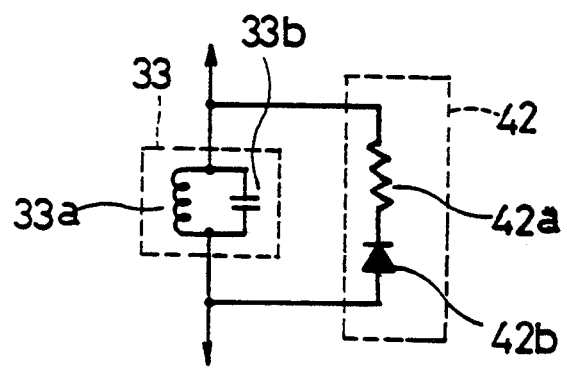
FIG. 29 is a circuit diagram showing a parallel resonance circuit 33 provided with a voltage limiting circuit 42.

FIG. 29 shows still another voltage limiting circuit 42, which is formed by a resistor 42a and a diode 42b whose cathode is connected to the resistor 42a. Assuming that VR represents a voltage drop by the resistor 42a, a voltage generated at a parallel resonator 33 is limited to VL1 (=VR+VF) or VL2 (=VR+BVR).

Figure 30:
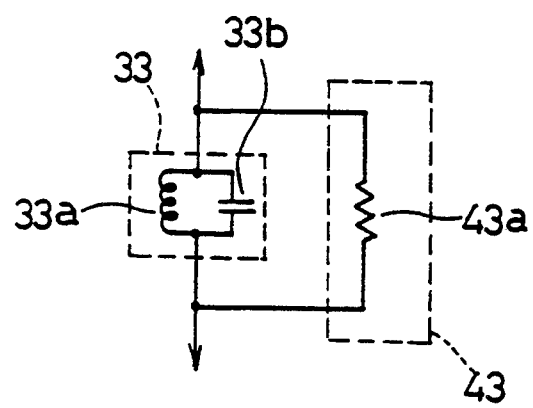
FIG. 30 is a circuit diagram showing a parallel resonance circuit 33 provided with a voltage limiting circuit 43.

FIG. 30 shows a further voltage limiting circuit 43, which is formed by a resistor 43a. A voltage generated at a parallel resonator 33 is limited to VR, which is a voltage drop at the resistor 43a.

Figure 31:
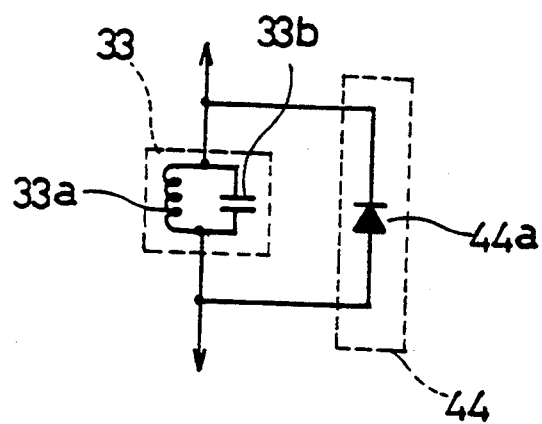
FIG. 31 is a circuit diagram showing a parallel rseonance circuit 33 provided with a voltage limiting circuit 44.

FIG. 31 shows a further voltage limiting circuit 44, which is formed by a diode 44a. A voltage generated at a parallel resonator 33 is limited to a forward voltage VF of the diode 44a or a reverse breakdown voltage BVR of the same.

Figure 32:
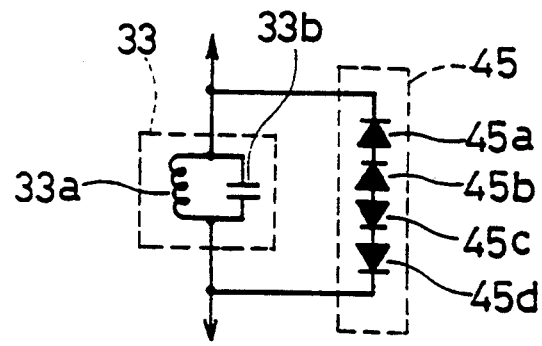
FIG. 32 is a circuit diagram showing a parallel resonance circuit 33 provided with a voltage limiting circuit 45.

FIG. 32 shows a further voltage limiting circuit 45, which is formed by four diodes 45a, 45b, 45c and 45d. An anode of the diode 45a is connected with a cathode of the diode 45b and respective anodes of the diodes 45b and 45c are connected with each other, while a cathode of the diode 45c is connected with an anode of the diode 45d. According to this voltage limiting circuit 45, a voltage generated at a parallel resonator 33 is limited to 2VL (=2VF+2BVR).

Figure 33:
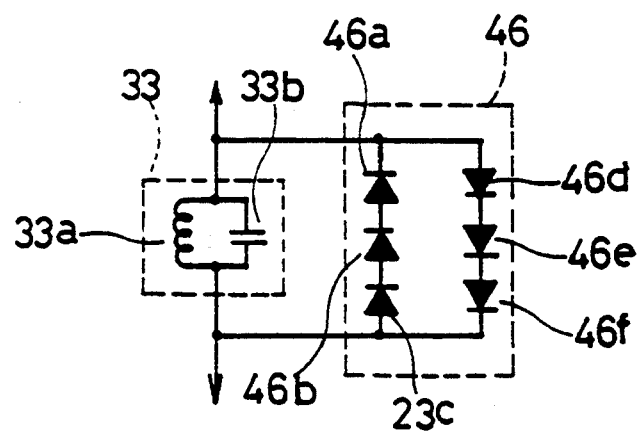
FIG. 33 is a circuit diagram showing a parallel resonance circuit 33 provided with a voltage limiting circuit 46.

FIG. 33 shows a further voltage limiting circuit 46, which is formed by reversely connecting a series circuit of three diodes 46a, 46b and 46c, which are connected in the forward direction, and a series circuit of three diodes 46d, 46e and 46f, which are similarly connected in the forward direction, in parallel with each other. A voltage generated at a parallel resonator 33 is limited to 3VF or 3BVR.

Figure 34:
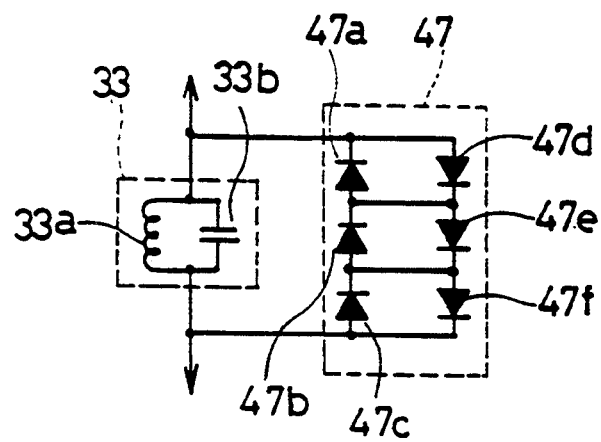
FIG. 34 is a circuit diagram showing a parallel resonance circuit 33 provided with a voltage limiting circuit 47.

As shown in FIG. 34, a voltage limiting circuit 47 may be formed by connecting diodes 47a to 47f similarly to FIG. 33 and connecting respective anodes of the diodes 47a and 47b with respective cathodes of the diodes 47d and 47e with each other. In this case, a voltage generated at a parallel resonator 33 is limited to 3VF or 3BVR, similarly to the case of the voltage limiting circuit 46.

Figure 35:
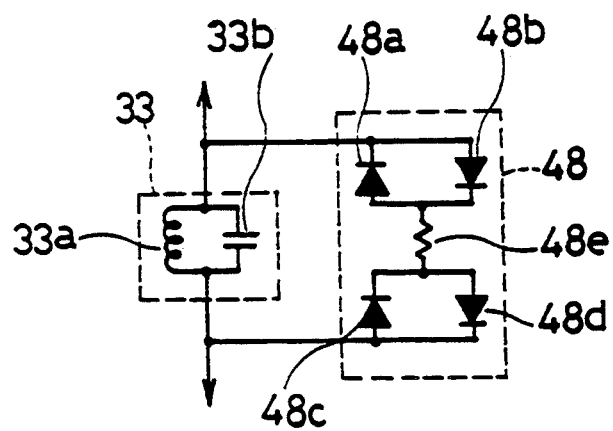
FIG. 35 is a circuit diagram showing a parallel resonance circuit 33 provided with a voltage limiting circuit 48.

As shown in FIG. 35, further, a voltage limiting circuit 48 may be formed by connecting a reverse parallel circuit of two diodes 48a and 48b, which are connected in parallel with each other in a reverse direction, and a reverse parallel circuit of two similar diodes 48c and 48d with each other by a resistor 48e. In this case, a voltage generated at a reverse parallel resonator 33 is limited to VL3 (=2VF+VR) or VL4 (=2BR +VR).

Each of the aforementioned voltage limiting circuits 40 to 48 can be applied to the inventive photoelectric conversion circuit for a range finder, similarly to the twenty-third embodiment shown in FIG. 27. Further, the voltage limiting circuits 40 to 48 are applicable to all of the eighteenth to twenty-second embodiments, as a matter of course.

D. Photoelectric Conversion Circuit for Automatic Focusing

Application of the present invention to an auto focusing apparatus for a camera is now described.

Figure 45:
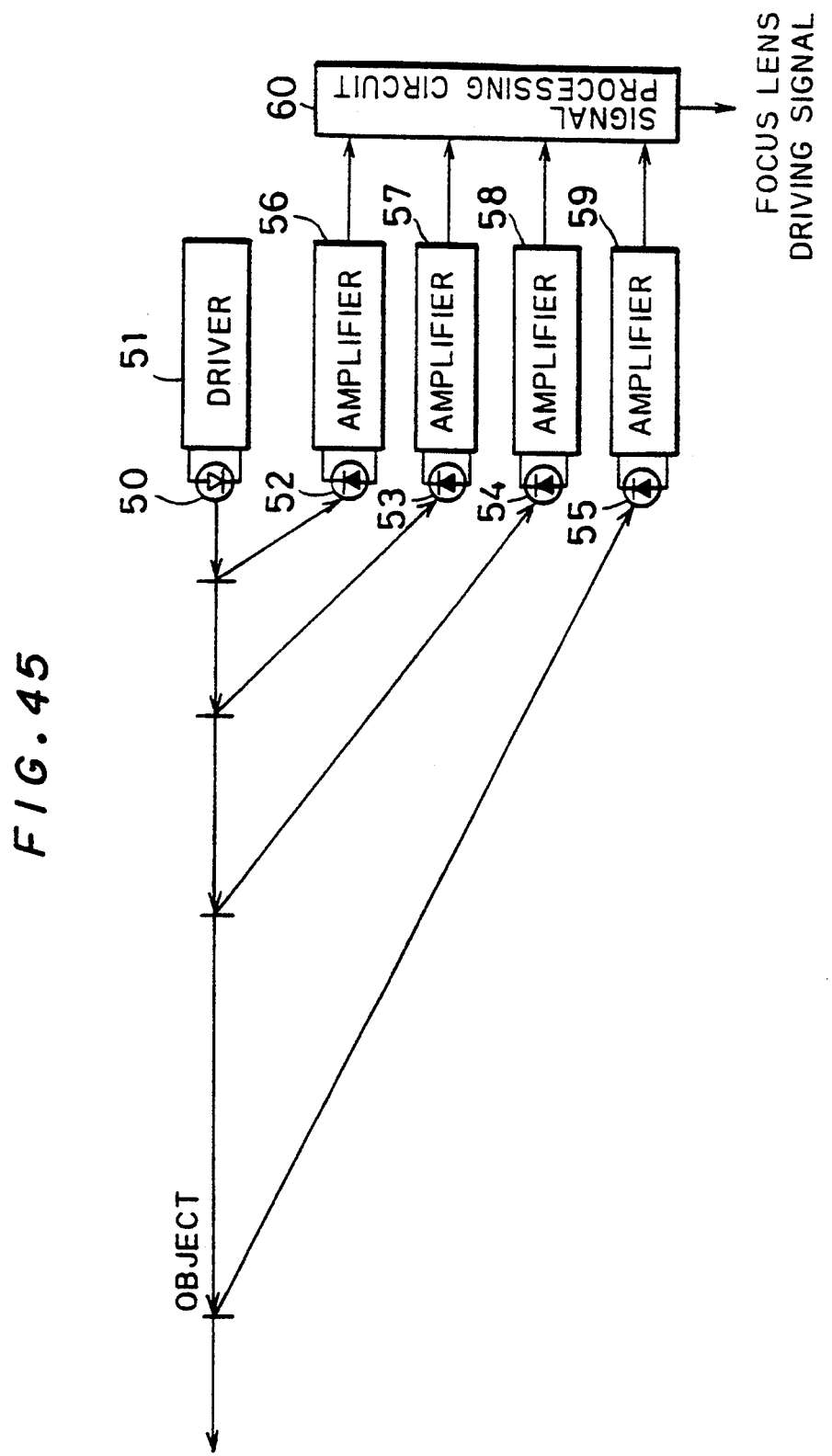
FIG. 45 illustrates the principle of automatic focusing.

FIG. 45 illustrates the principle of automatic focusing. An auto focusing apparatus includes a light emitting diode 50 for outputting an optical signal which is amplitude-modulated in a constant cycle, a driver 51 for driving the light emitting diode 50, photodetectors (PD) 52, 53, 54 and 55 for receiving the optical signal at prescribed angles respectively, amplifying circuits 56, 57, 58 and 59 for amplifying respective outputs of the photodetectors 52 to 55, and a signal processing circuit 60 for measuring a distance on the basis of outputs of the amplifying circuits 56 to 59 and driving a focus lens on the basis of the measured distance.

Signal light is emitted from the light emititng diode 50, and reflected by an object. The reflected signal light is received by one or two photodiodes. The amplifiers 56 to 59 amplify electric signals which are converted by corresponding ones of the photodiodes 52 to 55, to supply the same to the signal processing circuit 60. The signal processing circuit 60 calculates a distance to the object on the basis of intensity levels of the received signals, and drives the auto focus lens. Thus, the focal distance of the camera is automatically adjusted.

Figure 46:
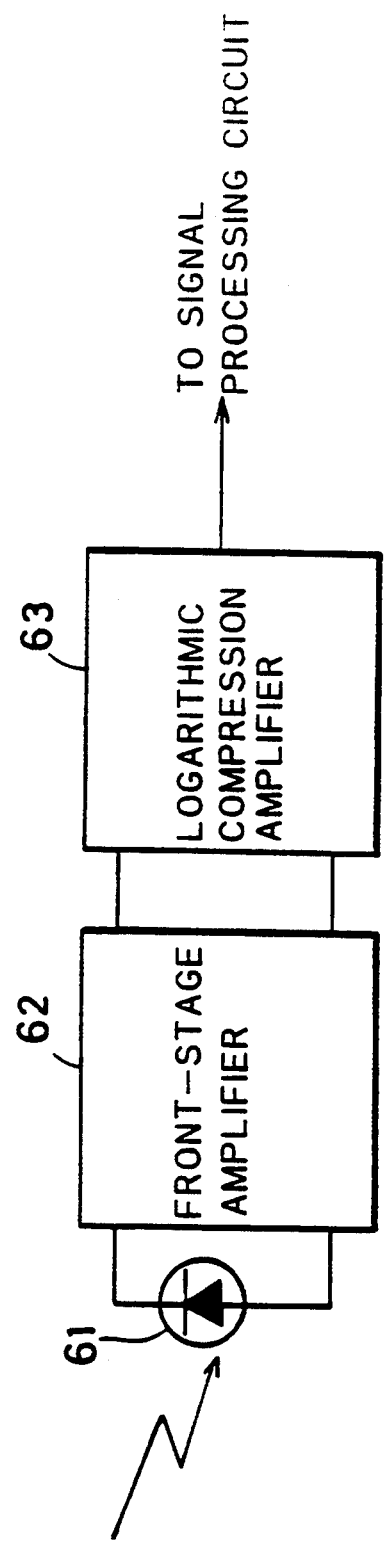
FIG. 46 is a block diagram showing a photoelectric conversion circuit for automatic focusing.

However, luminance of light is attenuated in proportion to the square of a distance, while the amount of reflection of signal light is extremely varied with reflectance of an object, such as reflectance of clothes, for example, when the object is a person. When an amplifying circuit has a constant amplification factor, therefore, an output of a photoelectric conversion circuit is inevitably saturated when an optical signal is strong. In order to avoid this, an amplifying circuit is devised. For example, FIG. 46 is a block diagram showing a photoelectric conversion circuit, which is disclosed in Japanese Patent Laying-Open Gazette No. 56-14906 (1981).

This photoelectric conversion circuit includes a photodetector 61, a front-stage amplifying circuit 62, and a logarithmic compression amplifier 63. The front-stage amplifying circuit 62 amplifies a pulsating component which is caused by signal light or the like to supply the amplified pulsating component to the rear-stage logarithmic compression amplifier 63, while the same feeds a stationary component which is caused by stationary light to the ground. The logarithmic compression amplifier 63 amplifies the received pulsating component in the form of logarithm. Consequently, the peak of the pulsating component is extremely compressed. Thus, the output of the photoelectric conversion circuit enters a dynamic range of a rear-stage signal processing circuit 60 (see FIG. 45).

However, a reading error is easily caused with the logarithmically compressed signal since the rear-stage signal processing circuit 60 reads strongness/weakness of a signal through its voltage level. Namely, when a signal is received by two photodetectors, large distortion is caused in the vicinity of the signal peak in a logarithmically compressed form, and hence it is difficult to decide strongness/weakness of the signal. When an amplifier having a controllable gain is employed, therefore, it is possible to obtain a photoelectric conversion circuit which enters a dynamic range of a rear-stage signal processing circuit and causes only a small reading error.

A problem of disturbance light is caused also in such a photoelectric conversion circuit for automatic focusing. Namely, the photodetector 61 also converts disturbance light to an electric signal with signal light. The disturbance light includes a light component from an artificial light source such as a fluorescent lamp or a mercury lamp which is driven by a ac power source and a natural light component such as sunlight. Namely, all light components but the signal light emitted from a light emitting diode correspond to the disturbance light, which further increases the reading error. Therefore, the present invention is applied to a circuit for modulating the signal light at a certain frequency and photoelectrically converting the signal light which is reflected by an object with a tuning circuit, for eliminating influence by the disturbance light and reducing the reading error.

Figure 36:
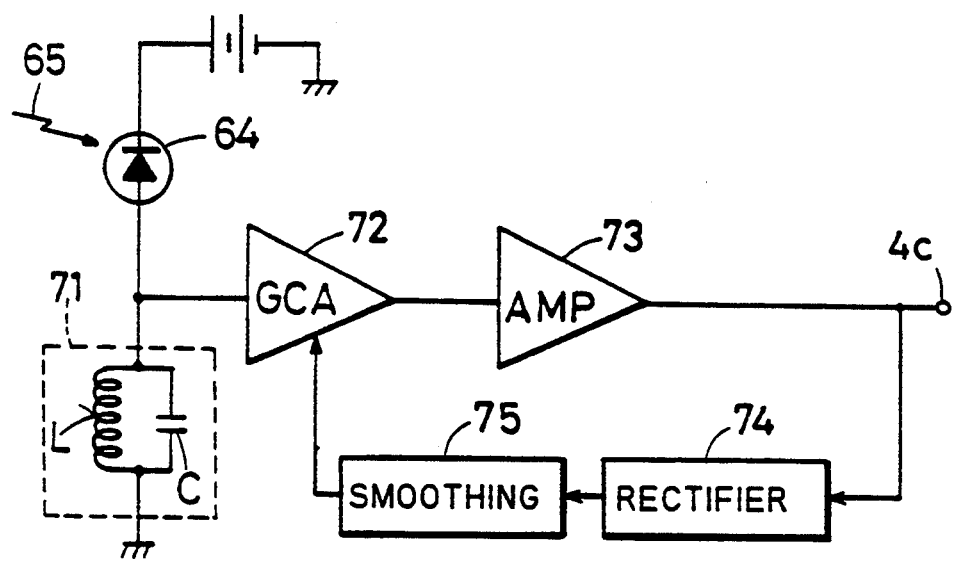
FIG. 36 is a circuit diagram showing a twenty-fourth embodiment of the present invention.

FIG. 36 is a block diagram showing a photoelectric conversion circuit for automatic focusing according to a twenty-fourth embodiment of the present invention. A positive potential is supplied to a cathode of a photodetector 64, while its anode is grounded through a parallel resonance circuit 71. The parallel resonance circuit 71 is so adjusted as to resonate with a modulation frequency for signal light. The anode is further connected to an input end of an amplifier (hereinafter referred to as "GCA") 72 having a gain control function. An input end of an amplifier 73 is connected to an output end of the GCA 72, while its output end is provided with an output terminal 4c. An input end of a rectifying circuit 74 is connected to the output terminal 4c, while an output end of the rectifying circuit 74 is connected to a control input end of the GCA 72 through a smoothing circuit 75.

The photodetector 64 photoelectrically converts incident light including signal light 65. This incident light also includes disturbance light such as light components from an artificial light source, natural light sources and the like, in addition to the signal light 65. A photoelectric conversion current obtained by photoelectric conversion is supplied to the parallel resonance circuit 71.

The parallel resonance circuit 71 comprises an inductor L and a capacitor C, which are connected in parallel with each other so that constants thereof resonate with the modulation frequency for the signal light 65. Thus, the parallel resonance circuit 71 is tuned with only a current component of the photoelectric conversion current corresponding to the signal light 65, so that only an electric signal corresponding to the signal light 65 is supplied to the GCA 72. The GCA 72 amplifies the received electric signal with an amplification factor which is set in a manner described below, and supplies the same to the amplifier 73. The amplifier 73 further amplifies the signal received from the GCA 72 with a constant amplification factor, and supplies the same to the output terminal 4c and the rectifying circuit 74.

The rectifying circuit 74 rectifies the signal amplified by the amplifier 73 and supplies the rectified signal to the smoothing circuit 75, which in turn smoothes the signal from the rectifying circuit 74, including a pulsating component, and supplies the smoothed signal to the control input end of the GCA 72. The GCA 72 automatically sets a gain (i.e., amplification factor) in response to the dc signal from the smoothing circuit 75. Namely, the GCA 72 reduces the gain when the dc signal is at a high level, while the same increases the gain when the dc signal is at a low level. Thus, the output of the GCA 72 can be maintained in a constant range, i.e., a dynamic range of the amplifier 73.

As described above, the output of the GCA 72 is fed back in order of the amplifier 73, the rectifying circuit 74, the smoothing circuit 75 and the GCA 72. Thus, even if the intensity of the signal light entering the photodetector 64 is extremely fluctuated, the output of the GCA 72 can be kept in the dynamic range of the amplifier 73, while a signal of a constant amplitude can be obtained in a gain-controlled range. Further, the parallel resonance circuit 71 removes the photoelectric conversion current caused by the disturbance light, whereby it is possible to detect and process only the signal light to avoid influence by the disturbance light.

Although the output signal is obtained from the output terminal 4c in this embodiment, a dc voltage outputted from the smoothing circuit 75 may alternatively be extracted as an output signal.

Figure 37:
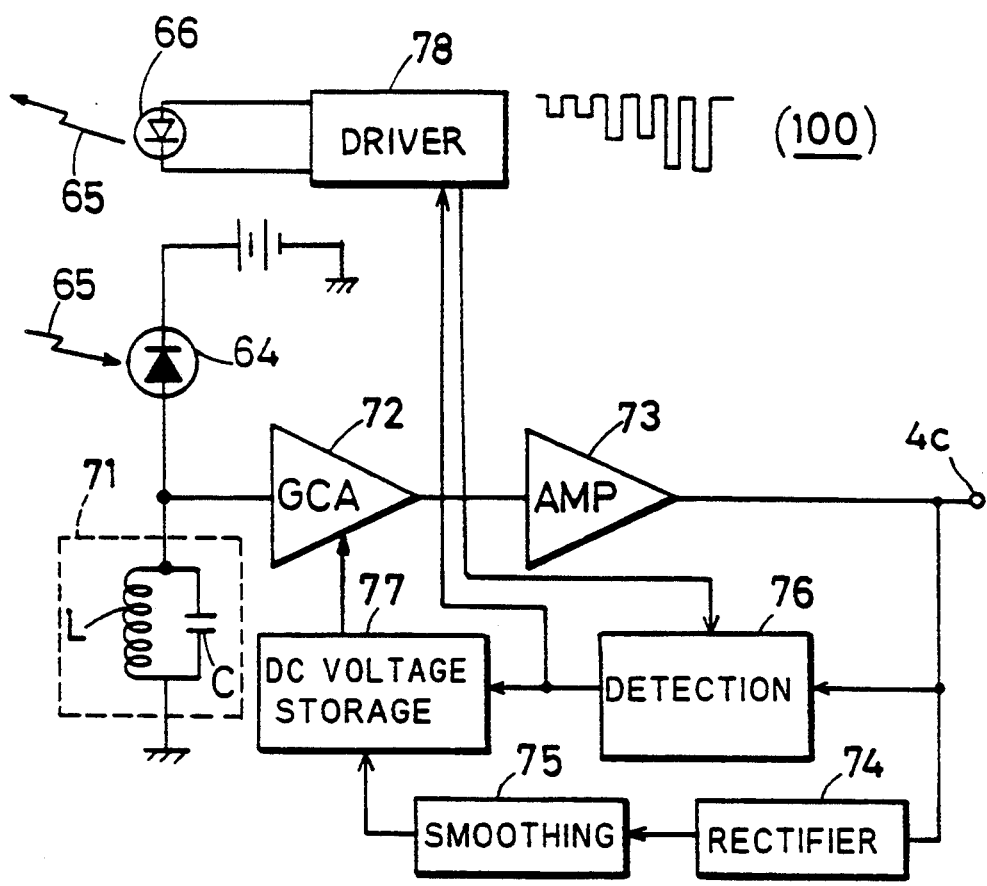
FIG. 37 is a circuit diagram showing a twenty-fifth embodiment of the present invention.

FIG. 37 is a block diagram showing a photoelectric conversion system for automatic focusing according to a twenty-fifth embodiment of the present invention. In addition to the twenty-fourth embodiment, a detection circuit 76 and a dc voltage storage circuit 77 are provided. The detection circuit 76 detects a fact that an output level of an amplifier 73 is stabilized in a constant range required for next-stage signal processing, while the dc voltage storage circuit 77 stores a dc voltage outputted from a smoothing circuit 75, in response to a detection output of the detection circuit 76. A driver 78 performs amplitude modulation so that intensity of signal light emitted from a light emitting diode (LED) 66 is stepwisely increased. A concrete method of this amplitude modulation is described later.

In an initial state, e.g., immediately after a shutter of an auto focus camera is pressed, for example, the driver 78 supplies a reset signal RS, indicating that the light emitting diode 66 is to be then driven, to the detection circuit 76. A driving voltage 100 for controlling the light emitting diode 66 is stepwisely increased. On the other hand, the dc voltage storage circuit 77 directly supplies an output of the smoothing circuit 75 to a GCA 72 without storing the same. The GCA 72 performs gain control in response to a dc signal received through the dc voltage storage circuit 77. When it is thus detected that an output level of the amplifier 73 is kept in a prescribed range, the detection circuit 76 supplies a detection signal to the dc voltage storage circuit 77 at this point of time. The dc voltage storage circuit 77 stores the dc voltage from the smoothing circuit 75 in response to this detection signal. The stored dc voltage is supplied for controlling the amount of gain of the GCA 72 with no regard to fluctuation of the output of the smoothing circuit 75, i.e., even if the amount of incident light is fluctuated.

On the other hand, the detection signal from the detection circuit 76 is also fed to the driver 78, to stop the stepwise amplitude modulation of the driving voltage 100 and make the amplitude of the signal light emitted from the light emitting diode 66 constant. Due to such control, the amount of gain of the GCA 72 and the intensity of the signal light are made constant, whereby it is thereafter possible to accurately compare strongness/weakess of output signals from a plurality of photoelectric conversion circuits of an auto focus camera.

Although the output of the smoothing circuit 75 is stored in the form of a dc voltage and this dc voltage is held and supplied to the GCA 72 as a gain control signal in this embodiment, the output of the smoothing circuit 75 may alternatively be stored in the form of a dc current, to hold this dc current and supply the same as a gain control signal for the GCA 72.

Figure 38:
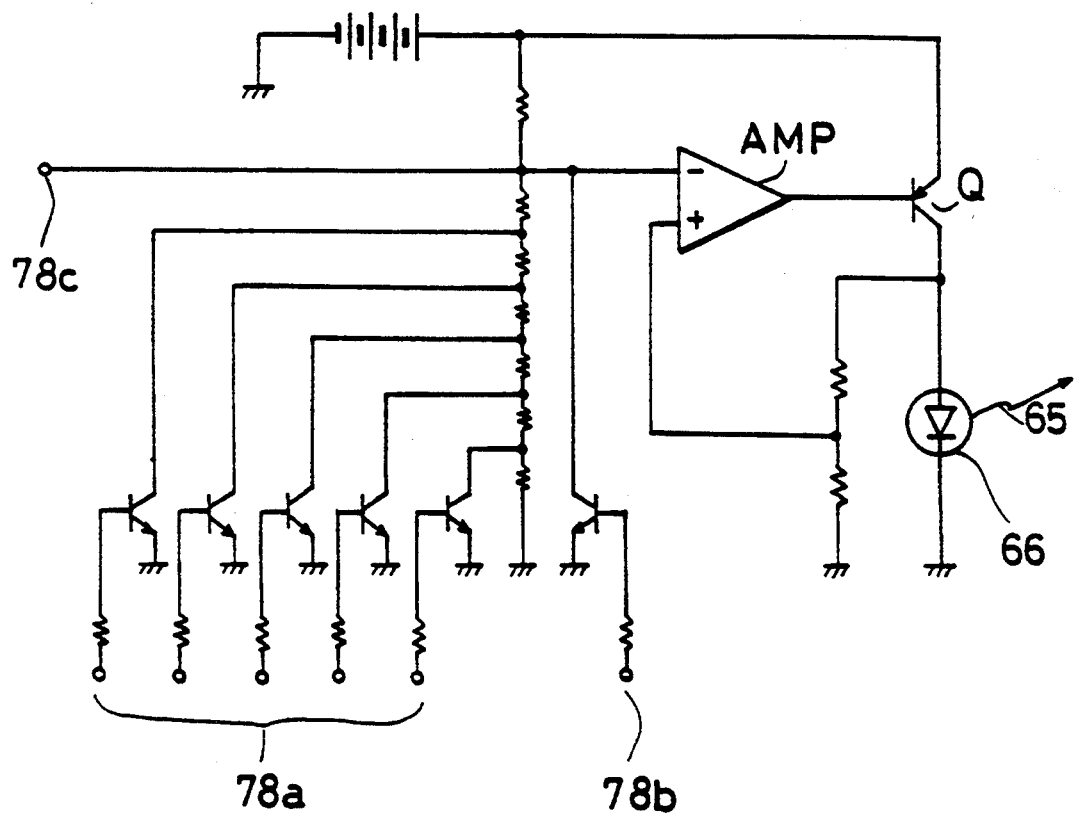
FIG. 38 is a circuit diagram showing a driver voltage generation circuit.

Means for stepwisely amplitude-modulating the driving voltage 100 is now described. FIG. 38 shows a driver voltage generation circuit which is contained in the driver 78 shown in FIG. 37. An appropriate bias voltage is supplied to a control input terminal group 78a, to turn on/off transistors connected with the terminal group 78a. Thus, the driving voltage 100 generated at a terminal 78c is determined. However, the driving voltage 100 is further pulsingly modulated by a pulse signal which is supplied to a terminal 78b, to have a waveform shown in FIG. 37. The frequency of this pulse signal corresponds to the resonance frequency of the parallel resonance circuit 71. The driving voltage 100 is amplified by an amplifier AMP, so that a current proportionate thereto flows to a light emitting diode 66 through a transistor Q. Thus, signal light controlled by the driving voltage 100 is obtained.

When the present invention is applied to automatic focusing, the rectifying circuit 74 and the smoothing circuit 75 may be removed to avoid signal delay caused by these circuits, thereby attaining high-speed operation.

Figure 39:
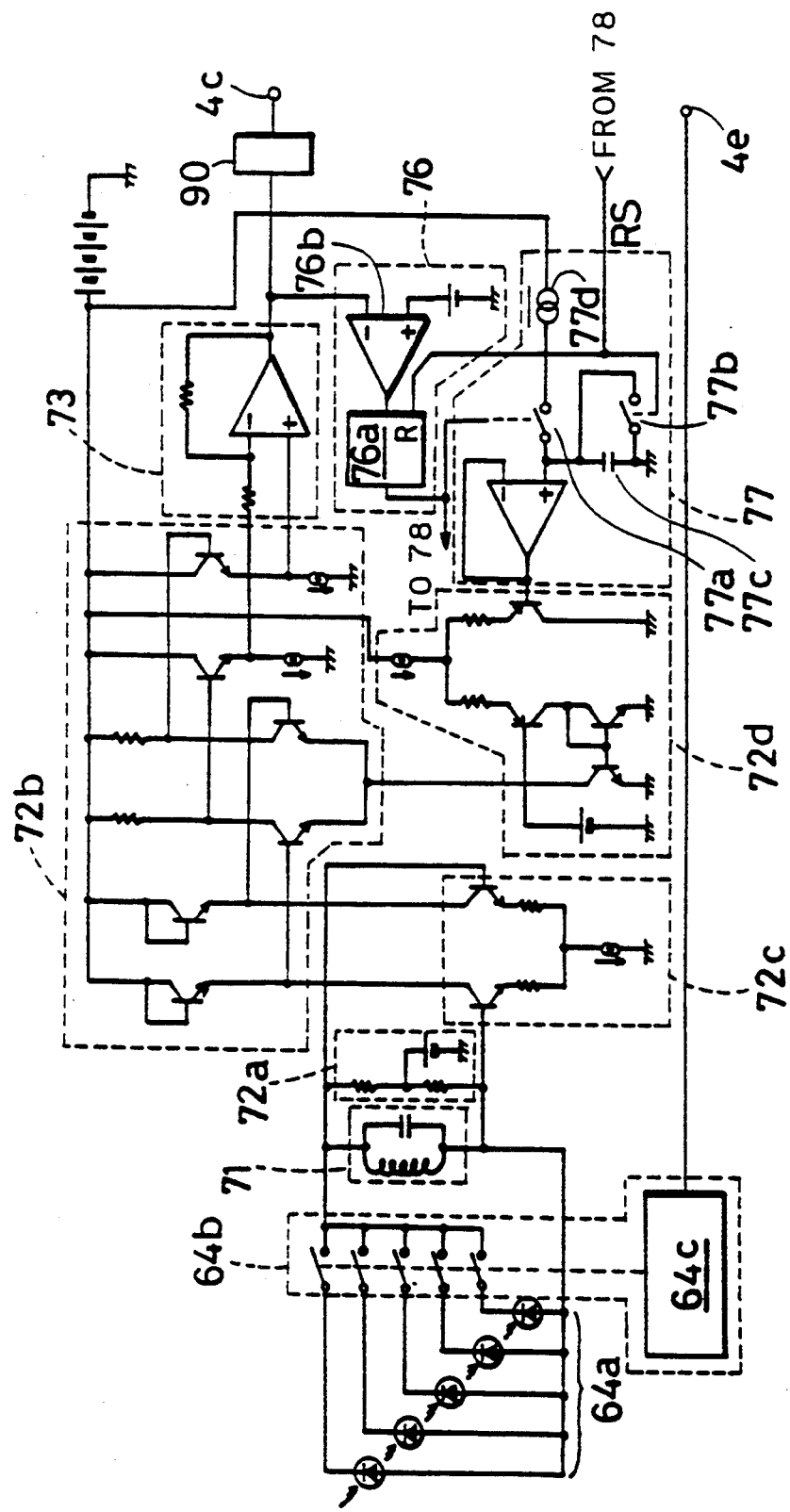
FIG. 39 is a circuit diagram showing a twenty-sixth embodiment of the present invention.

FIG. 39 is a circuit diagram of a twenth-sixth embodiment of the present invention, showing a circuit structure of a portion where a light-emitting circuit comprising the light emitting diode 66 and the driver 78, the rectifying circuit 74 and the smoothing circuit 75 are removed from the twenty-fifth embodiment shown in FIG. 37.

Light received by a photodetector group 64a is subjected to photoelectric conversion. A control signal inputted in a control input terminal 4e drives a photodiode changeover switch control circuit 64c, and controls which current is to be transmitted to a next stage in relation to the light inputted in the photodetector group 64a in a switching part 64b. A photoelectric conversion current, from which influence of disturbance light is removed by a parallel resonance circuit 71, is received in a differential amplifying part 72c, whose offset is controlled by a bias control part 72a. A gain control part 72b amplifies the output of the differential amplifying part 72c with a prescribed gain, and transmits the same to an amplifier 73. The gain of the gain control part 72b is set by the value of a current drawn by a voltage-to-current conversion circuit 72d. This current depends on an output voltage of a dc voltage storage circuit 77 which is formed by a sample-and-hold circuit. The bias control part 72a, the gain control part 72b, the differential amplifying part 72c and the voltage-to-current conversion circuit 72d form the GCA 72 of the twenty-fifth embodiment shown in FIG. 37. A detection circuit 76 comprises an operational amplifier 76b and a latch circuit 76a as shown in FIG. 39, to detect whether or not an output level of the amplifier 73 is kept in a prescribed range. A fixed potential applied to a non-inverting input of the operational amplifier 76b is compared with an output of the amplifier 73, so that the latch circuit 76a makes the driver 78 stop stepwise increase of a driver voltage 100 if the outputs are kept in a prescribed range, thereby setting the amount of emission of the light emitting diode 66 shown in FIG. 37. If the output level of the amplifier 73 is not in the prescribed range, the driver voltage 100 is continuously stepwisely increased.

A dc voltage storage circuit 77 comprises a differential amplifier which is provided with negative feedback, a current source 77d which is connected to a non-inverting input thereof through a holding switch 77a, a capacitor 77c which is connected between the non-inverting input and the ground, and a discharge switch 77b which is connected in parallel with the capacitor 77c. When a reset signal RS is received from the driver 78 in an initial state, the discharge switch 77b is once closed to discharge charges from the capacitor 77c. Then the holding switch 77a is closed and the discharge switch 77b is opened, so that the current source 77d charges the capacitor 77c.

Then the driving voltage 100 shown in FIG. 37 is stepwisely increased so that the amount of emission of the light emitting diode 66 as well as the output of the amplifier 73 are increased. When the output level is kept in the prescribed range, the detection circuit 76 supplies a detection signal to the dc voltage storage circuit 77 through the latch circuit 76a. Due to this detection signal, the holding switch 77a is opened to stop charging of the capacitor 77c. Therefore, the voltage at which the capacitor 77c is charged when the detection signal is received is stored. In the initial state, the reset signal RS also resets the latch circuit 76a.

The result of photoelectric conversion is obtained at the output terminal 4c through a peak holding circuit 90. When photoelectric conversion as to a certain photodetector is performed, it is possible to perform automatic focusing as described with reference to FIG. 45, by switching the photodetector to be subjected to photoelectric conversion by a control signal received in the control input terminal 4e.

Figure 40:
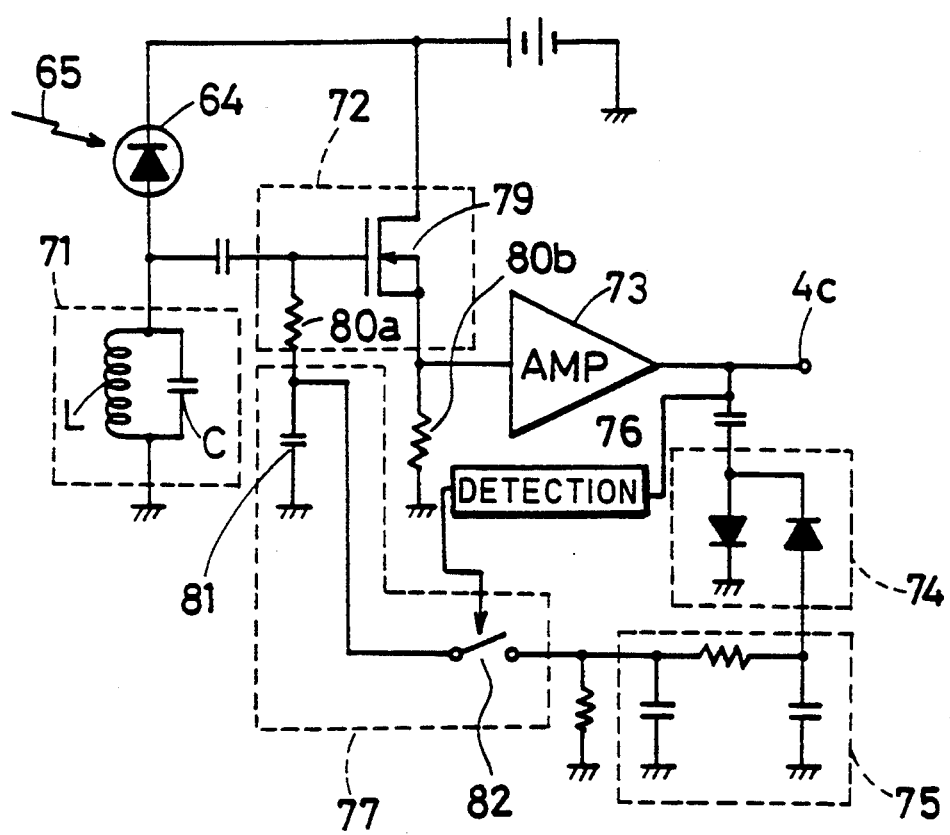
FIG. 40 is a circuit diagram showing a twenty-seventh embodiment of the present invention.
Figure 41:
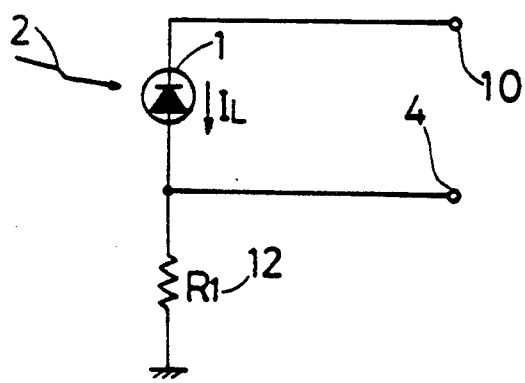
FIG. 41 is a block diagram showing a conventional photoelectric conversion circuit.
Figure 42:
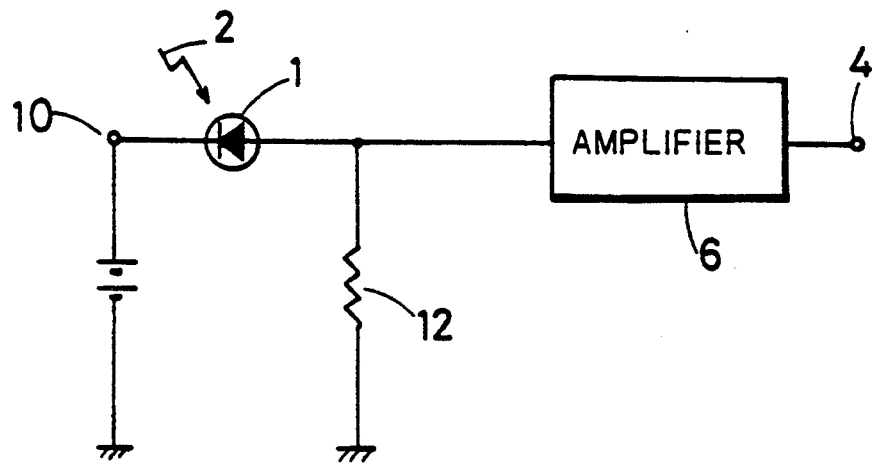
FIG. 42 is a block diagram showing another conventional photoelectric conversion circuit.
Figure 43:
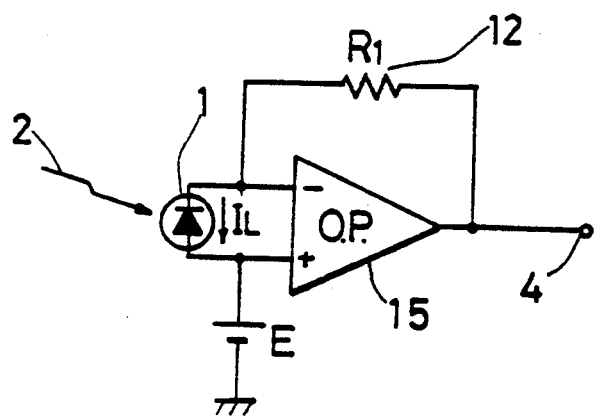
FIG. 43 is a block diagram showing the other conventional photoelectric conversion circuit.

While both of the amount of light at the light emitting side and the degree of amplification at the light receiving side may be controlled in the aforementioned manner for automatic focusing, only either one may alternatively be controlled. For example, FIG. 40 is a circuit diagram showing a twenty-seventh embodiment of the present invention, for controlling only the degree of amplification in a light receiving side.

A GCA 72 is formed by an insulating field-effect transistor (hereinafter referred to as "MOSFET") 79 and a resistor 80a. The MOSFET 79 has a gate electrode which receives an output of a photodetector 64, a drain electrode which is connected to a power potential, and a source electrode which is connected to an input of an amplifier 73.

A dc voltage storage circuit 77 is formed by a capacitor 81 and a switching circuit 82. The capacitor 81 has an electrode which is connected to the gate electrode of the MOSFET 79 through the resistor 80a, and another electrode which is grounded. The switching circuit 82 is connected between an output of a smoothing circuit 75 and one electrode of the capacitor 81, to perform switching in response to a detection output of a detection circuit Until the gain of an output signal appearing at an output terminal 4c is kept in a constant range, the detection circuit 76 outputs no detection signal and the switching circuit 82 remains in an ON state. Therefore, the dc voltage of the smoothing circuit 75 is supplied to the gate electrode of the MOSFET 79 through the switching circuit 82 and the resistor 80a. The MOSFET 79 is biased by the dc voltage from the smoothing circuit 75. Thus, the gain of the GCA 72 is controlled.

When the level of the output signal is kept in a prescribed range, this state is detected by the detection circuit 76, which in turn supplies a detection signal to the switching circuit 82. The switching circuit 82 is turned off in response to this. The capacitor 81 is charged by the dc voltage of the smoothing circuit 75, and holds the dc voltage at this OFF point of time. Namely, the MOSFET 79, the capacitor 81 and the switching circuit 82 serve as circuits for sampling and holding the dc voltage outputted from the smoothing circuit 75. The MOSFET 79, the capacitor 81 and the switching circuit 82 are thus employed so that the present invention can be applied to a photoelectric conversion circuit for automatic focusing with a small number of components, while it is possible to obtain an output signal having small distortion.

The dc voltage storage circuit 77 may be formed by a ROM to store the output of the smoothing circuit, which is changed in correspondence to light emission intensity of stepwise change of the light emitting diode 66 therein, as information, so that the output of the smoothing circuit 75 in actual operation is processed on the basis of the previously stored information to produce a gain control electric signal for the GCA 72. Thus, it is possible to implement a photoelectric conversion in consideration of dispersion between amounts of gain of a plurality of products.

While the invention has been shown and described in detail, the foregoing description is in all aspects illustrative and not restrictive. It is therefore understood tha numerous modifications and variations can be devised without departing from the scope of the invention.

What is claimed is:

1. A photoelectric conversion circuit comprising:
   first and second prescribed potentials;
   a semiconductor position sensing device comprising first and second electrodes and a third electrode being connected to said first prescribed potential, for receiving incident light including signal light being modulated in intensity at a prescribed frequency, converting said incident light to first current and second current, and detecting position of said incident light by comparing said first current and said second current, wherein said first current flows between said first and third electrodes, and said second current flows between said second and third electrodes;
   first and second resonators both electrically resonating with said prescribed frequency;
   a first differential amplifier having an output end being connected to an end of said first resonator, an inverting input being connected to said first electrode and the other end of said first resonator in common, and a non-inverting input being connected to said second prescribed potential; and
   a second differential amplifier having an output end being connected to an end of said second resonator, an inverting input being connected to said second electrode and the other end of said second resonator in common, and a non-inverting input being connected to said second prescribed potential.

2. A photoelectric conversion circuit in accordance with claim 1, wherein said resonator is a parallel resonator.

3. A photoelectric conversion circuit in accordance with claim 2, wherein both said first and second electrodes of said semiconductor position sensing device are anodes and said third electrode is a cathode.

4. A photoelectric conversion circuit in accordance with claim 2, wherein both said first and second electrodes of said semiconductor position sensing device are cathodes and said third electrode is an anode.

5. A photoelectric conversion circuit in accordance with claim 1, wherein each of said first and second resonators has a voltage limiting circuit having first and second terminals, and being connected in parallel thereto through said first and second terminals.

6. A photoelectric conversion circuit in accordance with claim 5, wherein said voltage limiting circuit consists essentially of a resistor having both ends which are connected to said first and second terminals respectively.

7. A photoelectric conversion circuit in accordance with claim 5, wherein said voltage limiting circuit consists essentially of a diode having both ends which are connected to said first and second terminals respectively.

8. A photoelectric conversion circuit in accordance with claim 5, wherein said voltage limiting circuit comprises first and second diodes,
   a cathode of said first diode is connected to said first terminal,
   a cathode of said second diode is conencted to said second terminal, and
   an anode of said first diode is connected to an anode of said second diode.

9. A photoelectric conversion circuit in accordance with claim 8, wherein said voltage limiting circuit further comprises:
   a third diode having a cathode which is connected to said anode of said first diode, and
   a fourth diode having a cathode which is connected to said anode of said second diode, and
   anodes of said third and fourth diodes are connected with each other.

10. A photoelectric conversion circuit in accordance with claim 5, wherein said voltage limiting circuit comprises:
   a first diode having an anode which is connected to said first terminal and a cathode which is connected to said second terminal, and
   a second diode having an anode which is connected to said second terminal and a cathode which is connected to said first terminal.

11. A photoelectric conversion circuit in accordance with claim 10, wherein
   said voltage limiting circuit further comprises:
   a third diode having a cathode which is connected to said second terminal and an anode which is connected to said cathode of said first diode, and
   a fourth diode having a cathode which is connected to said first terminal and an anode which is connected to said cathode of said second diode.

12. A photoelectric conversion circuit in accordance with claim 11, wherein said voltage limiting circuit further comprises:
   a fifth diode having an anode which is connected to said cathode of said second diode and a cathode which is connected to said anode of said fourth diode, and
   a sixth diode having an anode which is connected to said cathode of said first diode and a cathode which is connected to said anode of said third diode.

13. A photoelectric conversion circuit in accordance with claim 10, wherein said voltage limiting circuit further comprises:
   a third diode having an anode which is connected to said cathode of said first diode and said anode of said second diode and a cathode which is connected with said second terminal, and
   a fourth diode having a cathode which is connected to said cathode of said first diode and said anode of said second diode and an anode which is connected with said second terminal.

14. A photoelectric conversion circuit in accordance with claim 13, wherein said voltage limiting circuit further comprises a resistor having an end which is connected to said cathode of said first diode and said anode of said second diode in common and another end which is connected to said cathode of said fourth diode and said anode of said third diode in common.

15. A photoelectric conversion circuit in accordance with claim 13, wherein said voltage limiting circuit further comprises:
   a fifth diode having an anode which is connected to said cathode of said first diode and said anode of said second diode in common and a cathode which is connected to said cathode of said fourth diode and said anode of said third diode in common, and
   a sixth diode having a cathode which is connected to said cathode of said first diode and said anode of said second diode in common and an anode which is connected to said cathode of said fourth diode and said anode of said third diode in common.

16. A photoelectric conversion circuit in accordance with claim 5, wherein said voltage limiting circuit comprises:
   a diode having an anode which is connected to said second terminal, and
   a resistor which is connected between a cathode of said diode and said first terminal.

17. A photoelectric conversion circuit comprising:
   first and second prescribed potentials;
   a semiconductor position sensing device comprising first and second electrodes and a third electrode being connected to said first prescribed potential, for receiving incident light including signal light being modulated in intensity at a prescribed frequency, converting said incident light to first current and second current, and detecting position of said incident light by comparing said first current and said second current, wherein said first current flows between said first and third electrodes, and said second current flows between said second and third electrodes;
   first and second resonators electrically resonating with said prescribed frequency;
   a first differential amplifier having a non-inverting input being connected to said first electrode and being connected to said second prescribed potential through said first resonator, as well as an output end and an inverting input being connected with each other; and
   a second differential amplifier having a non-inverting input being connected to said second electrode and being connected to said second prescrbed potential through said second resonator, as well as an output end and an inverting input being connected with each other.

18. A photoelectric conversion circuit in accordance with claim 17, wherein both said first and second resonators are paraellel resonators.

* * * * *